(12) United States Patent
Lee et al.

(10) Patent No.: US 10,886,280 B2
(45) Date of Patent: Jan. 5, 2021

(54) SEMICONDUCTOR DEVICE HAVING A GATE AND METHOD OF FORMING THE SAME

(71) Applicant: Samsung Electronics Co., Ltd., Suwon-si (KR)

(72) Inventors: Dongjin Lee, Seoul (KR); Ji-Eun Lee, Suwon-si (KR); Kyoung-Ho Jung, Suwon-si (KR); Satoru Yamada, Yongin-si (KR); Moonyoung Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/588,360

(22) Filed: Sep. 30, 2019

(65) Prior Publication Data

US 2020/0027885 A1 Jan. 23, 2020

Related U.S. Application Data

(63) Continuation of application No. 15/204,805, filed on Jul. 7, 2016, now Pat. No. 10,446,557.

(30) Foreign Application Priority Data

Sep. 18, 2015 (KR) ........................ 10-2015-0132502

(51) Int. Cl.
*H01L 21/28* (2006.01)
*H01L 27/108* (2006.01)
*H01L 29/49* (2006.01)
*H01L 21/3215* (2006.01)
*H01L 29/51* (2006.01)

(52) U.S. Cl.
CPC .. *H01L 27/10876* (2013.01); *H01L 21/28088* (2013.01); *H01L 27/10814* (2013.01); *H01L 27/10823* (2013.01); *H01L 27/10855* (2013.01); *H01L 29/4966* (2013.01); *H01L 21/3215* (2013.01); *H01L 29/513* (2013.01); *H01L 29/517* (2013.01); *H01L 29/518* (2013.01)

(58) Field of Classification Search
None
See application file for complete search history.

(56) References Cited

U.S. PATENT DOCUMENTS 6,476,454 B2 11/2002 Suguro
6,846,734 B2 1/2005 Amos
(Continued)

FOREIGN PATENT DOCUMENTS

CN 101095223 12/2007
CN 101361173 A 2/2009
(Continued)

OTHER PUBLICATIONS

First Office Action issued in corresponding Chinese Patent Application No. CN 201610829464.2, dated Dec. 4, 2019.

*Primary Examiner* — Bradley Smith
(74) *Attorney, Agent, or Firm* — Myers Bigel, P.A

(57) ABSTRACT

Provided are a semiconductor device having a gate and a method of forming the same. The method includes forming a gate dielectric, forming a first conductive material layer on the gate dielectric, forming a source material layer on the first conductive material layer, and diffusing a first element included in the source material layer into the first conductive material layer by performing a thermal treatment process to form a doped material layer.

17 Claims, 40 Drawing Sheets

(56) References Cited

U.S. PATENT DOCUMENTS

| | | |
|---|---|---|
| 7,390,709 B2 | 6/2008 | Doczy et al. |
| 7,425,497 B2 | 9/2008 | Chudzik et al. |
| 7,947,610 B2 | 5/2011 | Tsunasilma |
| 8,557,651 B2 | 10/2013 | Lee |
| 9,384,986 B2 | 7/2016 | Yin et al. |
| 2009/0050960 A1 | 2/2009 | Pattanayak |
| 2010/0193872 A1 | 8/2010 | Carter |
| 2011/0284971 A1 | 11/2011 | Sakashita |
| 2013/0099323 A1 | 4/2013 | Zhu |
| 2013/0187236 A1 | 7/2013 | Xie |
| 2013/0256770 A1 | 10/2013 | Huh |
| 2014/0054775 A1 | 2/2014 | Kim |
| 2015/0249015 A1 | 9/2015 | Ando |

FOREIGN PATENT DOCUMENTS

| | | |
|---|---|---|
| CN | 103219231 | 7/2013 |
| CN | 103367401 | 10/2013 |
| CN | 103378008 | 10/2013 |
| CN | 103531540 | 1/2014 |
| CN | 103855012 | 6/2014 |
| JP | 2010141129 | 6/2010 |
| KR | 101116726 | 2/2012 |

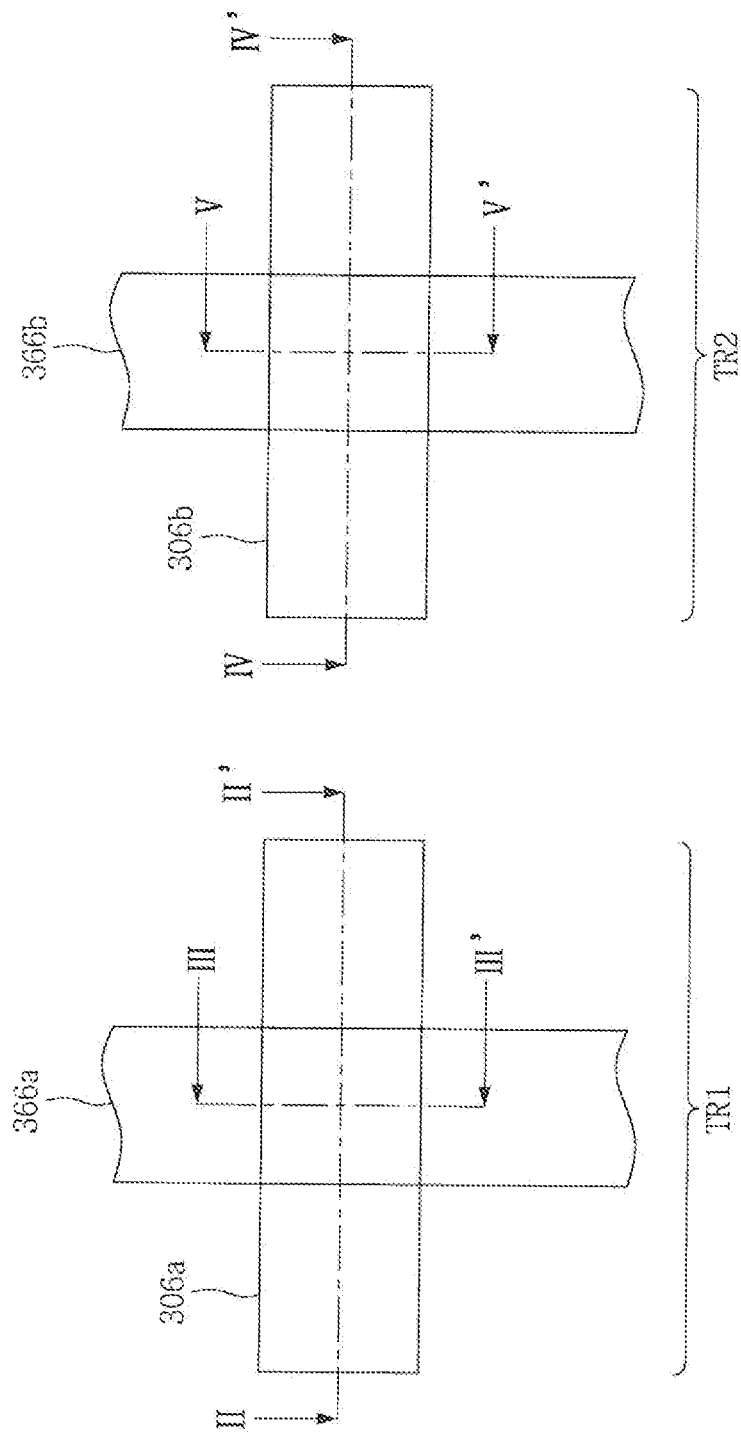

SEMICONDUCTOR DEVICE HAVING A GATE AND METHOD OF FORMING THE SAME

CROSS-REFERENCE TO RELATED APPLICATION

This application is a continuation of U.S. patent application Ser. No. 15/204,805, filed Jul. 7, 2016, which itself claims priority under 35 U.S.C. § 119 to Korean Patent Application No. 10-2015-0132502 filed on Sep. 18, 2015, the disclosures of which are hereby incorporated by reference in their entireties.

BACKGROUND

Technical Field

Embodiments of the inventive concept relate to a semiconductor device having a gate and a method of forming the same, and an electronic system incorporating the semiconductor device.

Description of Related Art

Recently, research on three-dimensional transistors has been actively progressing. As the size of three-dimensional transistors is gradually decreasing, a threshold voltage characteristic and the reliability of a gate dielectric are being gradually degraded.

SUMMARY

In accordance with an embodiment of the inventive concept, a method of forming a semiconductor device is provided. The method includes forming a gate dielectric, forming a first conductive material layer on the gate dielectric, forming a source material layer on the first conductive material layer, the source material comprising a first element, and diffusing the first element into the first conductive material layer by performing a thermal treatment process to form a conductive doped material layer.

In an embodiment, the method may further include removing the source material layer formed on the doped material layer.

In an embodiment, the method may further include, after the removing of the source material layer, partially etching the doped material layer to decrease a thickness of the doped material layer.

In an embodiment, the method may further include forming a second conductive material layer on the doped material layer.

In an embodiment, a doping concentration of the first element in a first portion of the doped material layer may be higher than that of the first element in a second portion of the doped material layer. The first portion is farther away from the gate dielectric than the second portion.

In an embodiment, the first element included in the source material layer may be diffused into the first conductive material layer and may not be diffused into the gate dielectric during the thermal treatment process.

In an embodiment, the method may further include forming a gate trench which crosses an active region. The gate dielectric may be formed on an inner wall of the gate trench.

In an embodiment, the method may further include removing the source material layer formed on the doped material layer, forming a second conductive material layer on the doped material layer, and etching the second conductive material layer and the doped material layer to form a gate electrode. The first conductive material layer may be conformally formed on the gate dielectric, the second conductive material layer may fill the gate trench, and the gate electrode may partially fill the gate trench.

In an embodiment, an upper end portion of the first conductive material layer of the gate electrode may be formed at a lower level than an upper end portion of the second conductive material layer of the gate electrode relative to the gate dielectric.

In an embodiment, the method may further include forming a sacrificial gate on a semiconductor substrate, forming an interlayer insulating layer on side surfaces of the sacrificial gate, and removing the sacrificial gate to form a gate trench. The gate dielectric may be formed on the semiconductor substrate having the gate trench, the first conductive material layer may be conformally formed on the gate dielectric, and the second conductive material layer may fill the gate trench.

In accordance with an embodiment of the inventive concept, a method of forming a semiconductor device is provided. The method includes forming a gate trench in an active region, forming a gate dielectric on an inner wall of the gate trench, forming a conductive material layer on the gate dielectric, forming a source material layer on the conductive material layer, the source material layer comprising a first element, and diffusing the first element into the conductive material layer to form a doped material layer having a different work function from the conductive material layer.

In an embodiment, the method may further include removing the source material layer after the forming of the doped material layer, and partially etching the doped material layer to decrease a thickness of the doped material layer.

In an embodiment, the conductive material layer is a first conductive material layer and the method may further include removing the source material layer after the forming of the doped material layer, and forming a second conductive material layer which fills the gate trench on the doped material layer.

In an embodiment, the method may further include etching the second conductive material layer and the doped material layer to form a gate electrode. The gate electrode may partially fill the gate trench.

In an embodiment, the gate dielectric may not include the first element after the forming of the doped material layer.

In an embodiment, the conductive material layer may be formed on the gate dielectric and partially fill the gate trench.

In an embodiment, the method may further include forming an insulating buffer spacer on a side wall of the gate trench formed on the conductive material layer before the forming of the source material layer.

In accordance with an embodiment of the inventive concept, a method of forming a semiconductor device is provided. The method includes forming a gate trench which crosses an active region, forming a gate dielectric on an inner wall of the gate trench, conformally forming a first conductive material layer on the gate dielectric, forming a source material layer on the first conductive material layer, the source material layer comprising a first element, diffusing the first element into the first conductive material layer to form a doped material layer having a different work function from the first conductive material layer, removing the source material layer formed on the doped material layer, forming a second conductive material layer on the doped material layer, and etching the second conductive material layer and the doped material layer and forming a gate electrode which partially fills the gate trench.

In an embodiment, the doped material layer may have a lower work function than the first conductive material layer.

In an embodiment, the method may further include, before forming the second conductive material layer, partially etching the doped material layer to decrease a thickness of the doped material layer.

In accordance with an embodiment of the inventive concept, a semiconductor device is provided. The device includes a gate trench that crosses an active region, a gate dielectric on an inner wall of the gate trench, a gate electrode that is on the gate dielectric and partially fills the gate trench, and an insulating capping pattern that is on the gate electrode and fills remaining portions of the gate trench. The gale electrode includes a doped material layer and a conductive material layer formed on the doped material layer. The doped material layer is formed of a material with which a first element is doped in a metal nitride. The gate dielectric is formed of an oxide not including the first element. The first element is an element on a periodic table of elements, which decreases a work function of the metal nitride.

In an embodiment, a doping concentration of the first element in a first portion of the doped material layer may be higher than that of the first element in a second portion of the doped material layer. The first portion is farther away from the gate dielectric than the second portion.

In an embodiment, the doped material layer may include a WN material or TiN and the first element may comprise La.

In an embodiment, the doped material layer may cover side surfaces and a bottom of the conductive material layer.

In an embodiment, an upper end portion of the doped material layer may be formed at a lower level than an upper end portion of the conductive material layer relative to the gate dielectric.

In accordance with an embodiment of the inventive concept, a method of forming a semiconductor device includes forming a gate dielectric, forming a conductive material layer on the gate dielectric, forming a source material layer on the conductive material layer, the source material being separated from the gate dielectric so as not to contact the gate dielectric and comprising a first element, and diffusing the first element into the conductive material layer by performing a thermal treatment process to form a doped material layer.

In an embodiment, the conductive material layer may have a substantially uniform thickness and the conductive material layer may have a substantially uniform thickness.

In an embodiment, a work function of the conductive material layer may be higher than a work function of the doped material layer.

In an embodiment, a doping concentration of the first element in a first portion of the doped material layer may be higher than that of the first element in a second portion of the doped material layer. The first portion is farther away from the gate dielectric that the second portion.

In an embodiment, the doped material layer may include one of WN and TiN and the first element may be La.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are explained in detail in the specification set forth below.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIG. 9 is a plan view illustrating an example of a semiconductor device in accordance with an embodiment of the inventive concept;

DETAILED DESCRIPTION OF THE EMBODIMENTS

Figure 1:
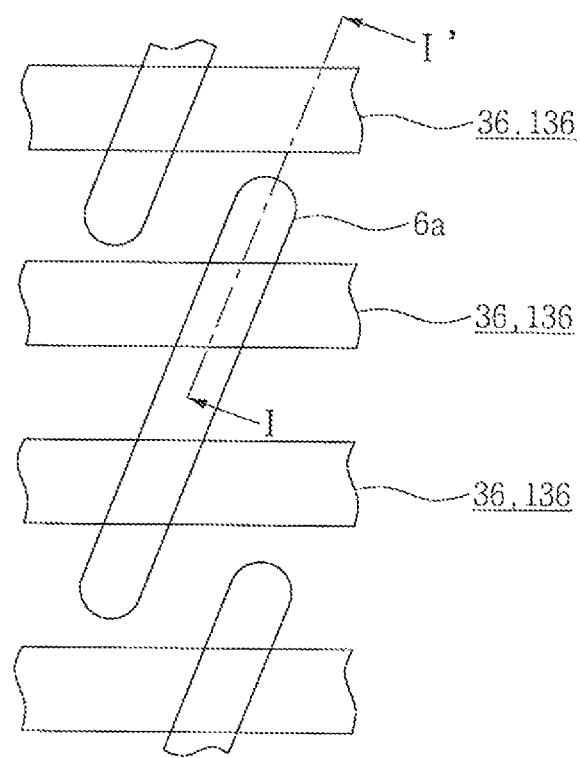
FIG. 1 is a plan view illustrating a semiconductor device in accordance with an embodiment of the inventive concept.

Advantages and features of the inventive concept and methods of accomplishing them will be made apparent with reference to the accompanying drawings and some embodiments to be described below. The inventive concept may, however, be embodied in various different forms, and should be construed as limited, not by the embodiments set forth herein, but only by the accompanying claims. Rather, these embodiments are provided so that this disclosure is thorough and complete and fully conveys the inventive concept to those skilled in the art. In the drawings, the sizes and relative sizes of layers and regions may be exaggerated for clarity. The same reference symbols denote the same components throughout the specification.

Embodiments are described herein with reference to cross-sectional views, plan views, and/or block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Therefore, regions illustrated in the drawings are schematic in nature, and their shapes are not intended to limit the inventive concept but only to illustrate characteristic forms of regions of devices.

The thicknesses of layers and regions in the drawings may be exaggerated for the sake of clarity. Further, it will be understood that when a layer is referred to as being "on" another layer or a substrate, the layer may be formed directly on the other layer or the substrate, or there may be an intervening layer therebetween. The same reference numerals indicate the same components throughout the specification.

Terms such as "top," "bottom," "upper," "lower," "above," "below," and the like are used herein to describe the relative positions of elements or features. For example, when an upper part of a drawing is referred to as a "top" and a lower part of a drawing as a "bottom" for the sake of convenience, in practice, the "top" may also be called a "bottom" and the "bottom" a "top" without departing from the teachings of the inventive concept.

Furthermore, throughout this disclosure, directional terms such as "upper," "intermediate," "lower," and the like may be used herein to describe the relationship of one element or feature with another, and the inventive concept should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of the present inventive concept.

The terminology used herein to describe embodiments of the invention is not intended to limit the scope of the inventive concept.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a plan view illustrating a semiconductor device according to embodiments of the inventive concept.

Figure 2A:
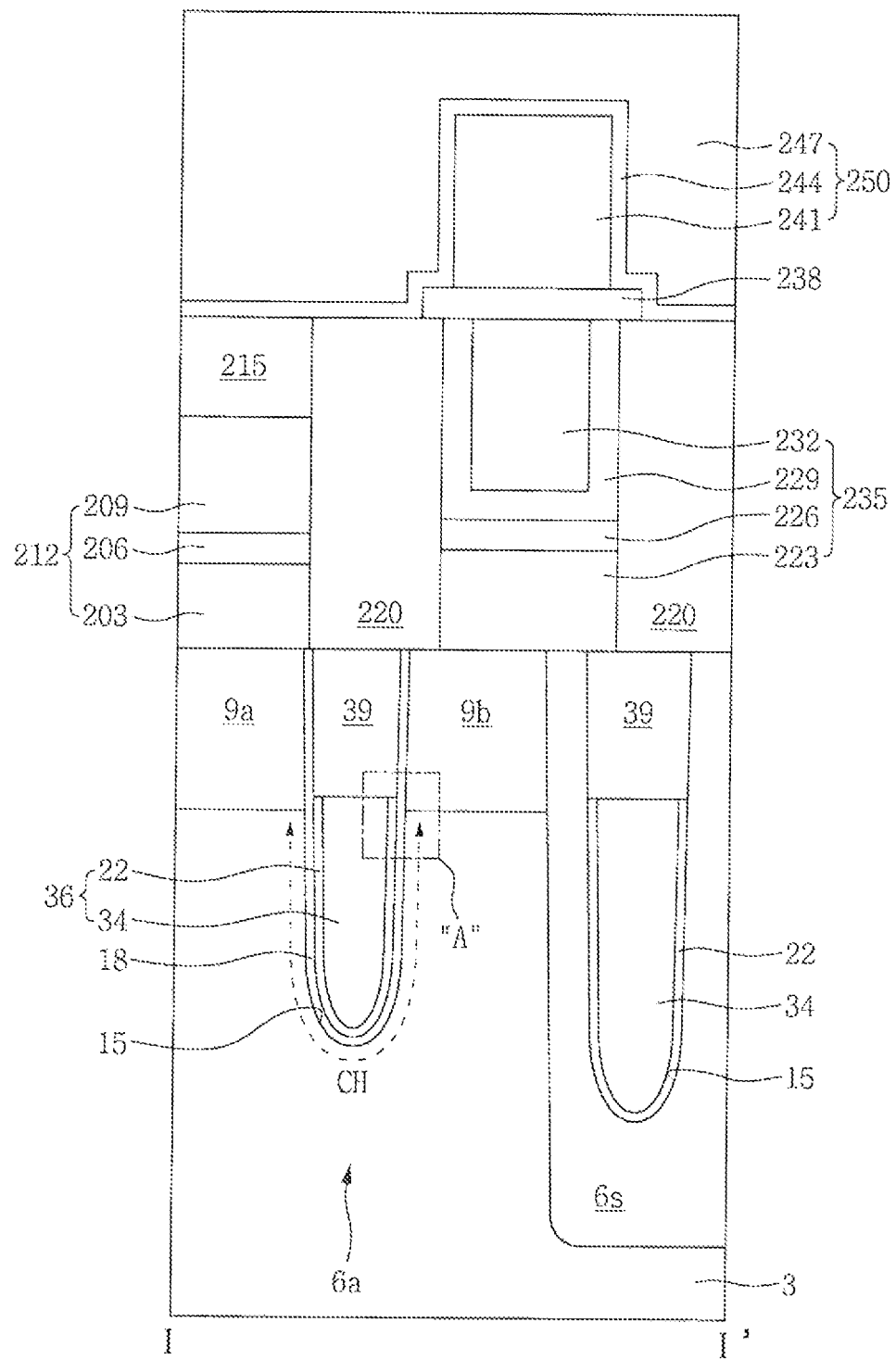
FIG. 2A is a cross-sectional view illustrating an example of a semiconductor device in accordance with an embodiment of the inventive concept.
Figure 2B:
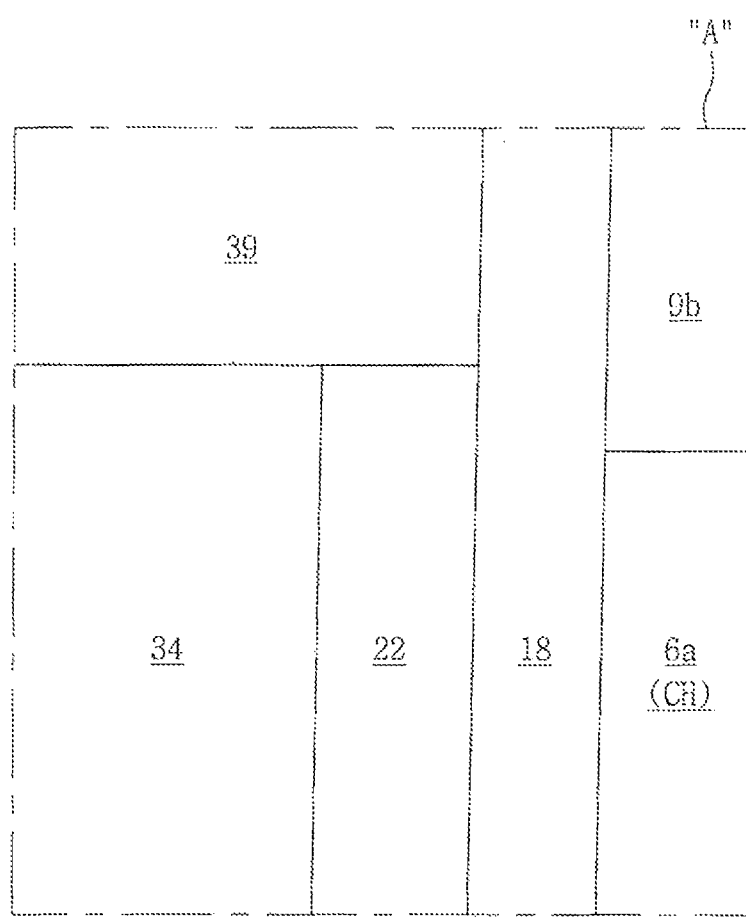
FIG. 2B is a partially enlarged view of a portion A of FIG. 2A.

FIG. 2A is a cross-sectional view illustrating an example of a semiconductor device in accordance with an embodiment of the inventive concept, and FIG. 2B is a partially enlarged view of a portion A of FIG. 2A.

Figure 3A:
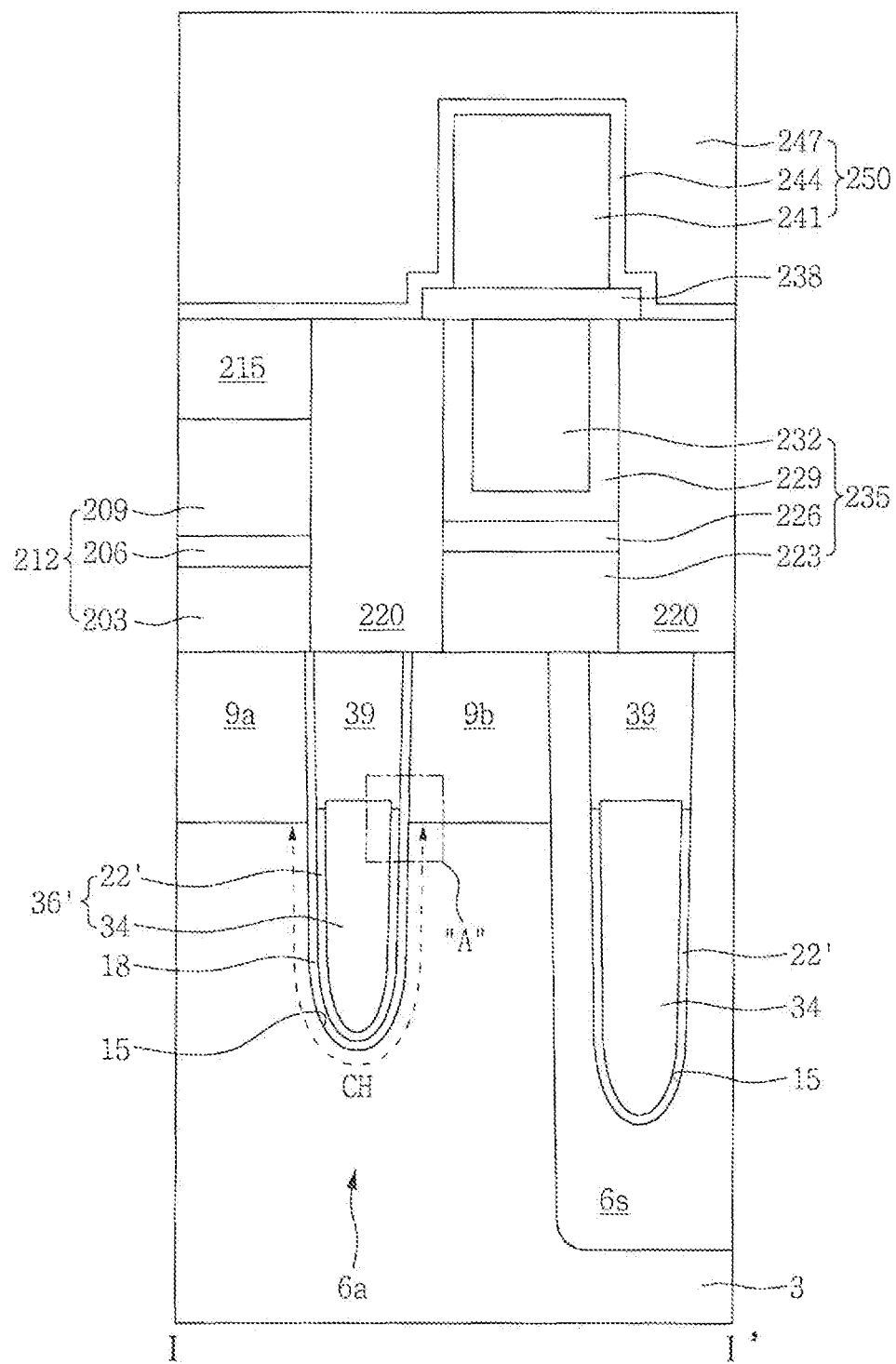
FIG. 3A is a cross-sectional view illustrating an example of a semiconductor device in accordance with an embodiment of the inventive concept.
Figure 3B:
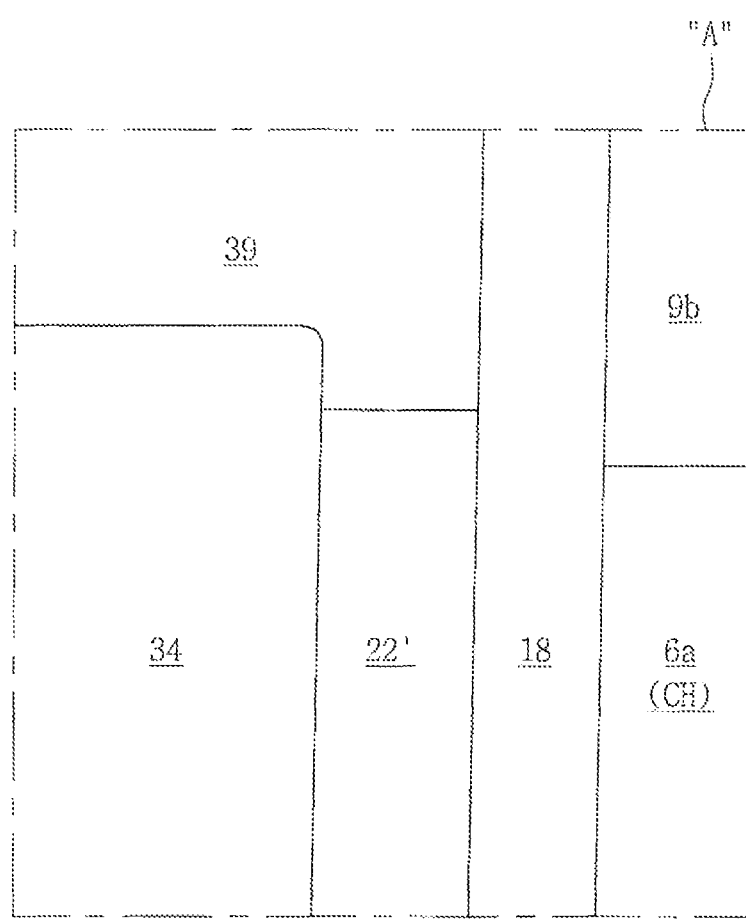
FIG. 3B is a partially enlarged view of a portion A of FIG. 3A.
Figure 4A:
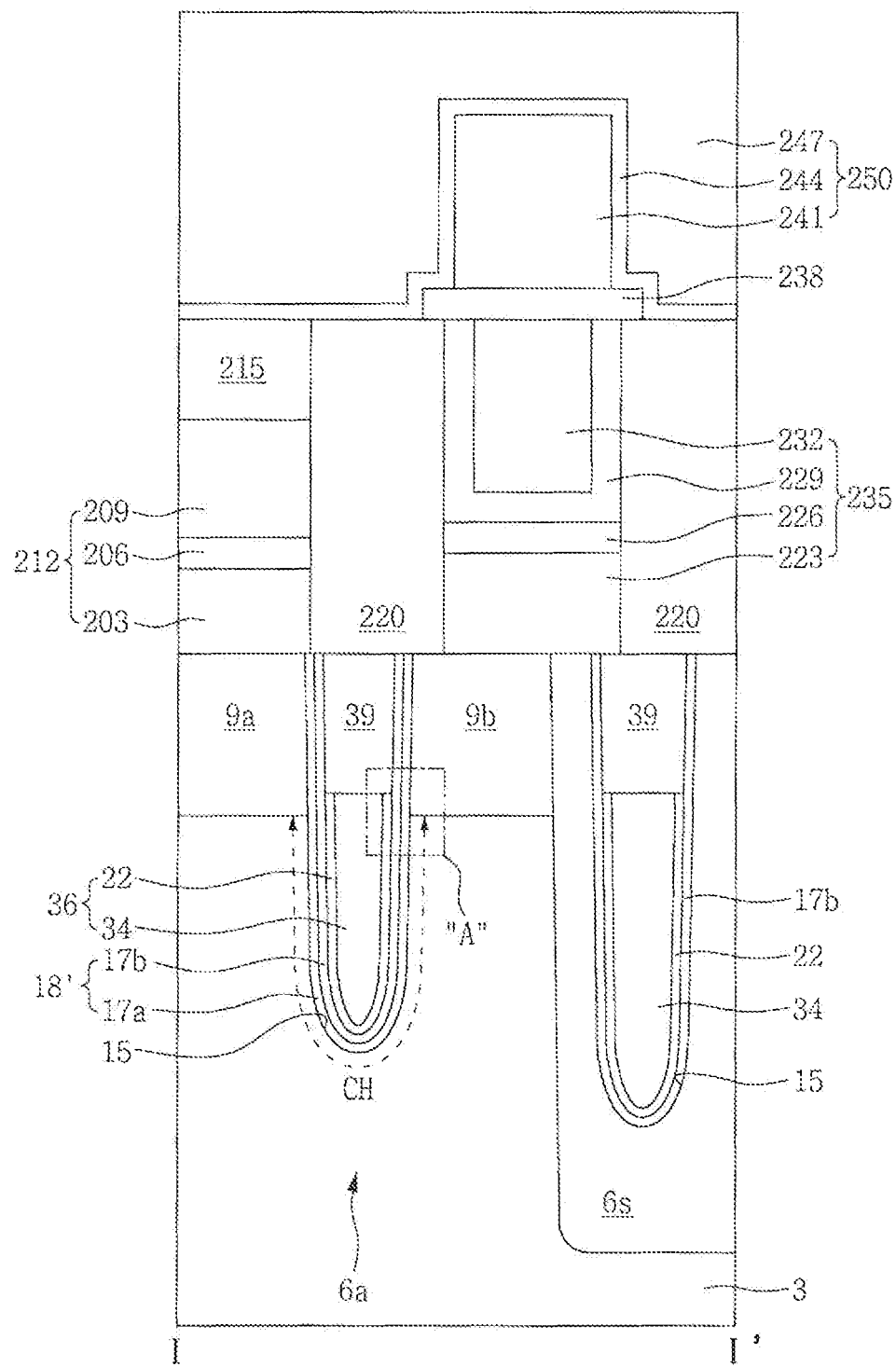
FIG. 4A is a cross-sectional view illustrating an example of a semiconductor device in accordance with an embodiment of the inventive concept.
Figure 4B:
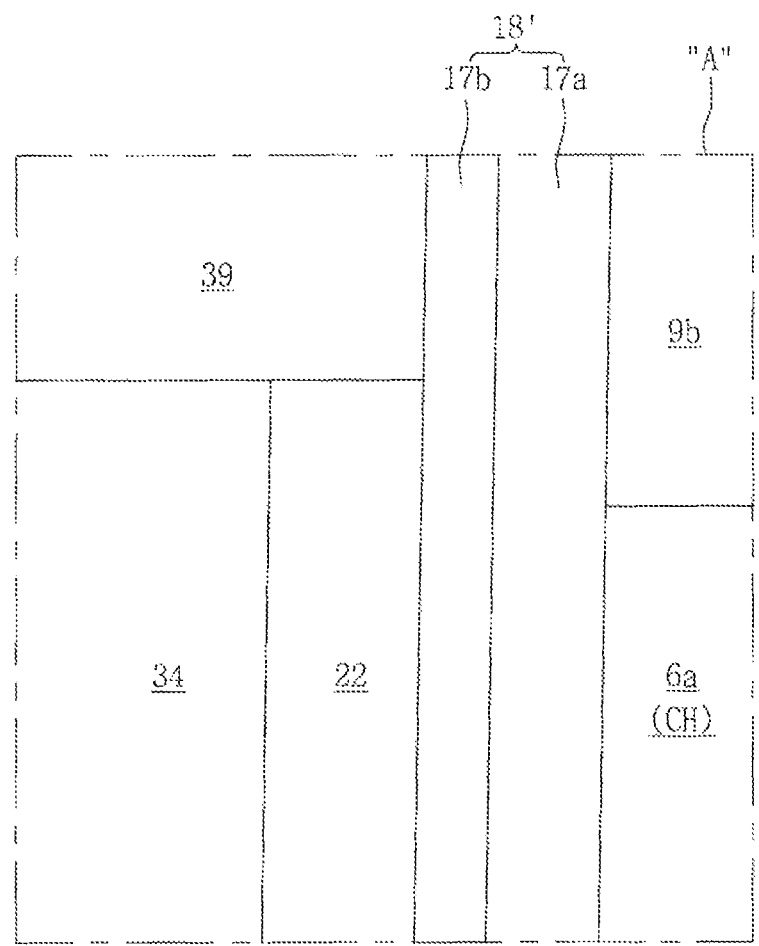
FIG. 4B is a partially enlarged view of a portion A of FIG. 4A.
Figure 5A:
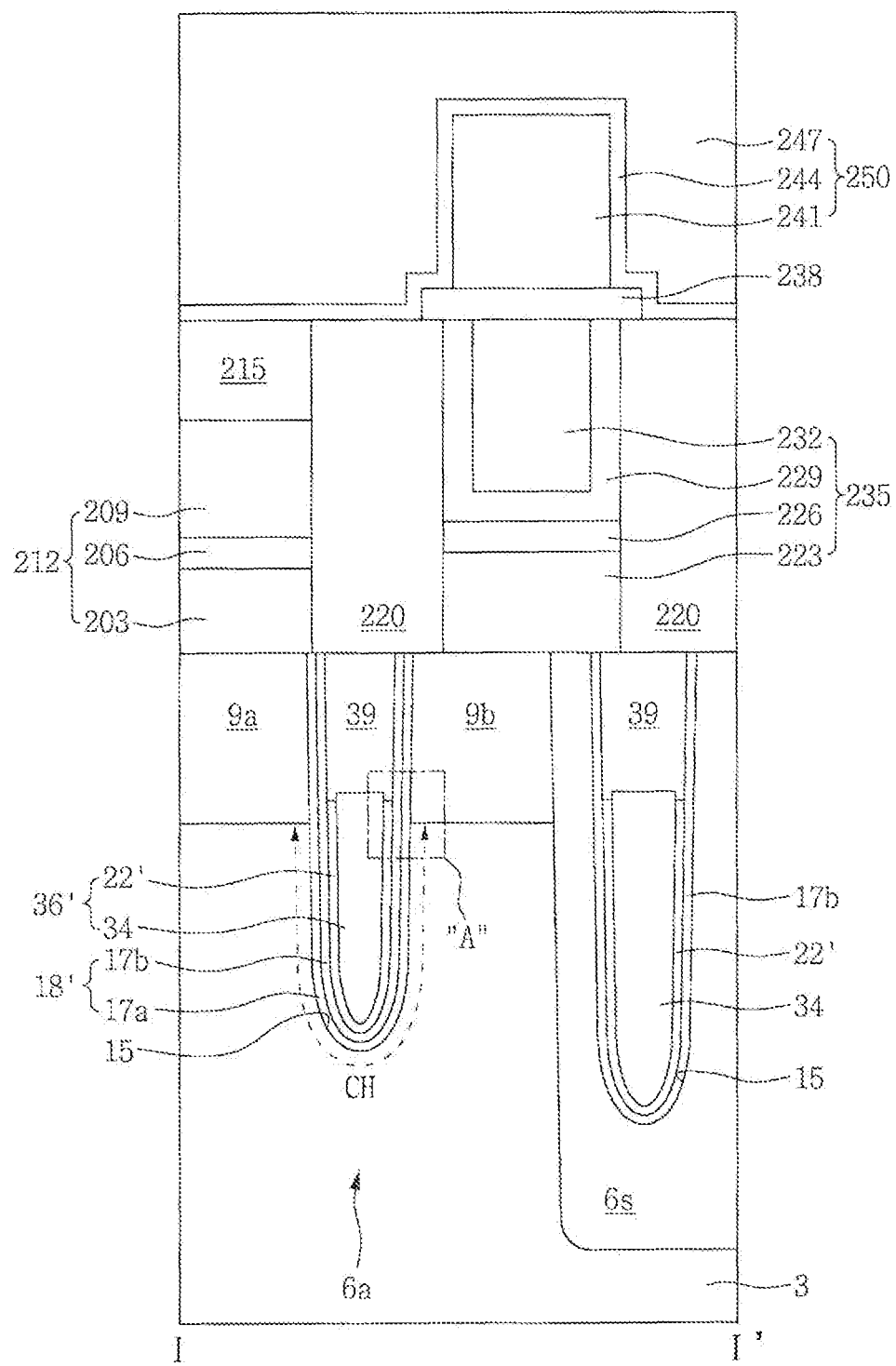
FIG. 5A is a cross-sectional view illustrating an example of a semiconductor device in accordance with an embodiment of the inventive concept.
Figure 5B:
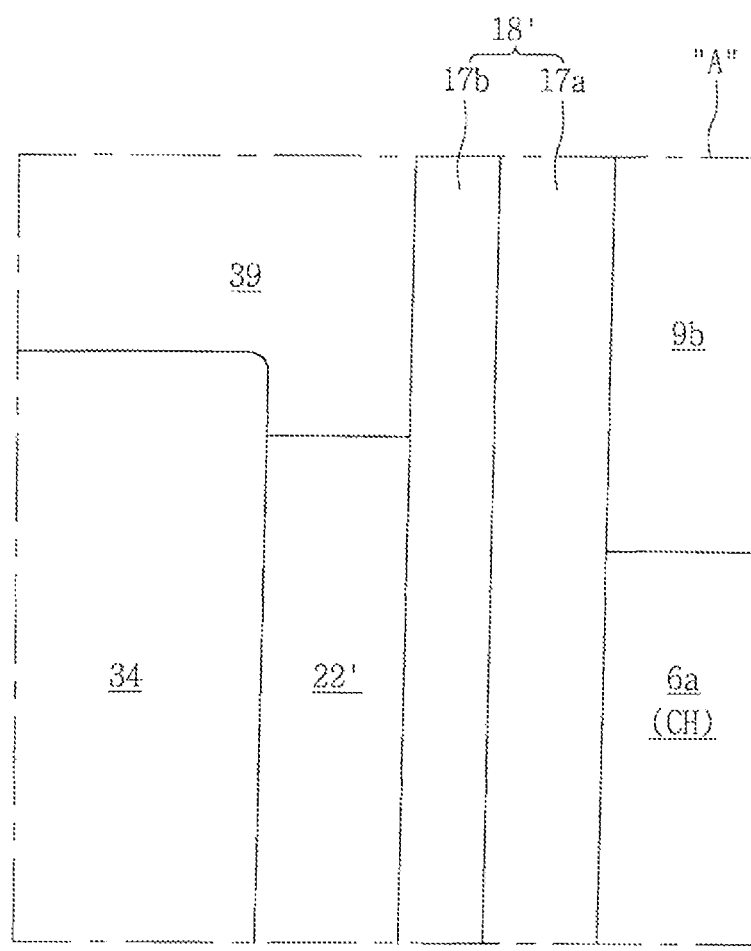
FIG. 5B is a partially enlarged view of a portion A of FIG. 5A.
Figure 6A:
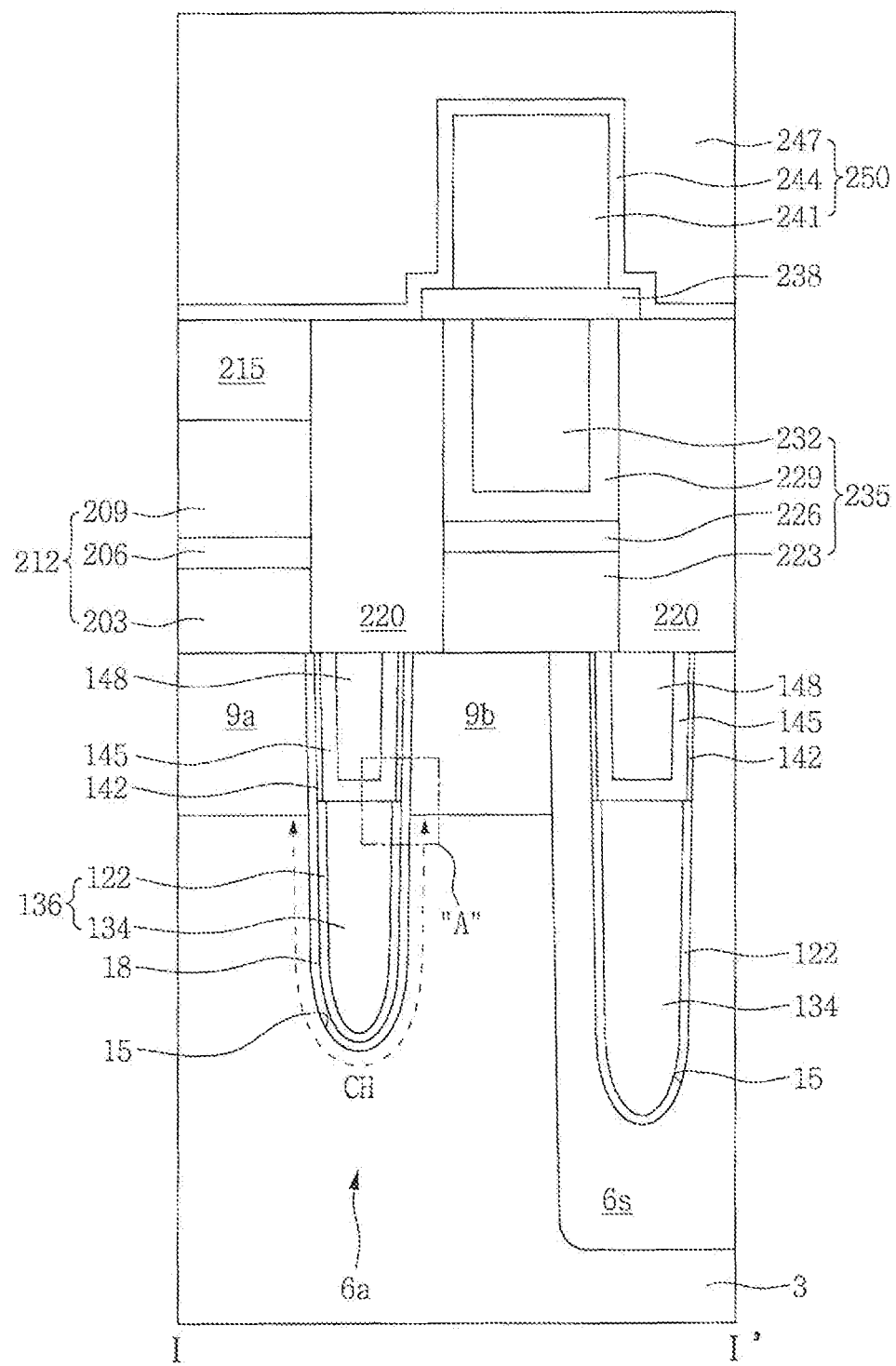
FIG. 6A is a cross-sectional view illustrating an example of a semiconductor device in accordance with an embodiment of the inventive concept.
Figure 6B:
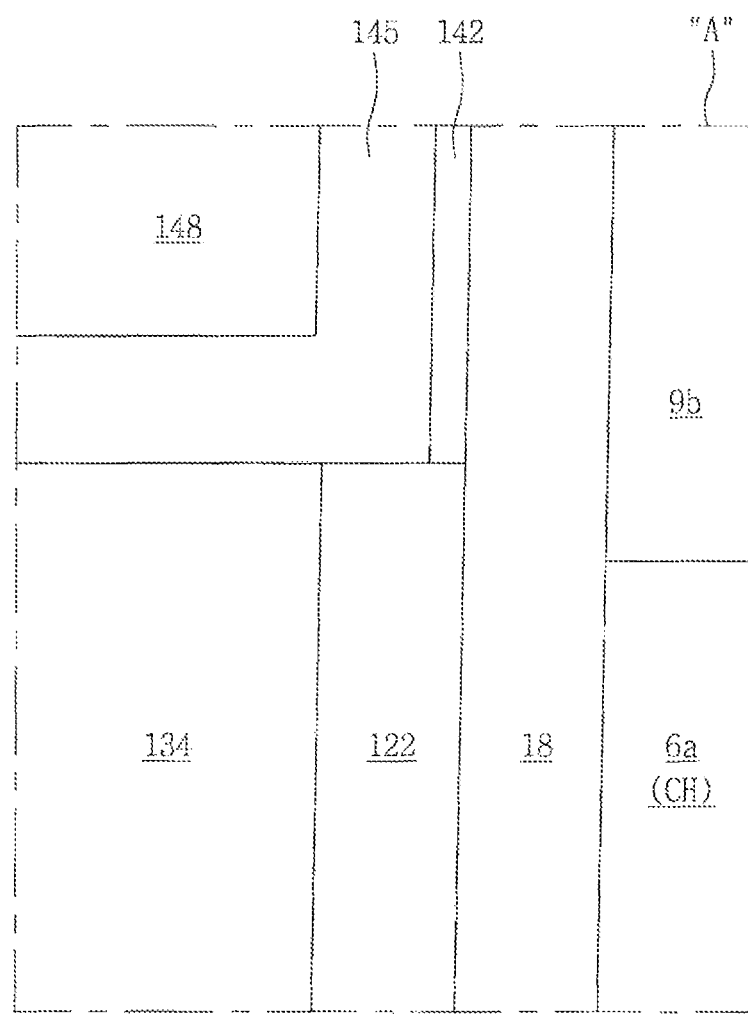
FIG. 6B is a partially enlarged view of a portion A of FIG. 6A.
Figure 7A:
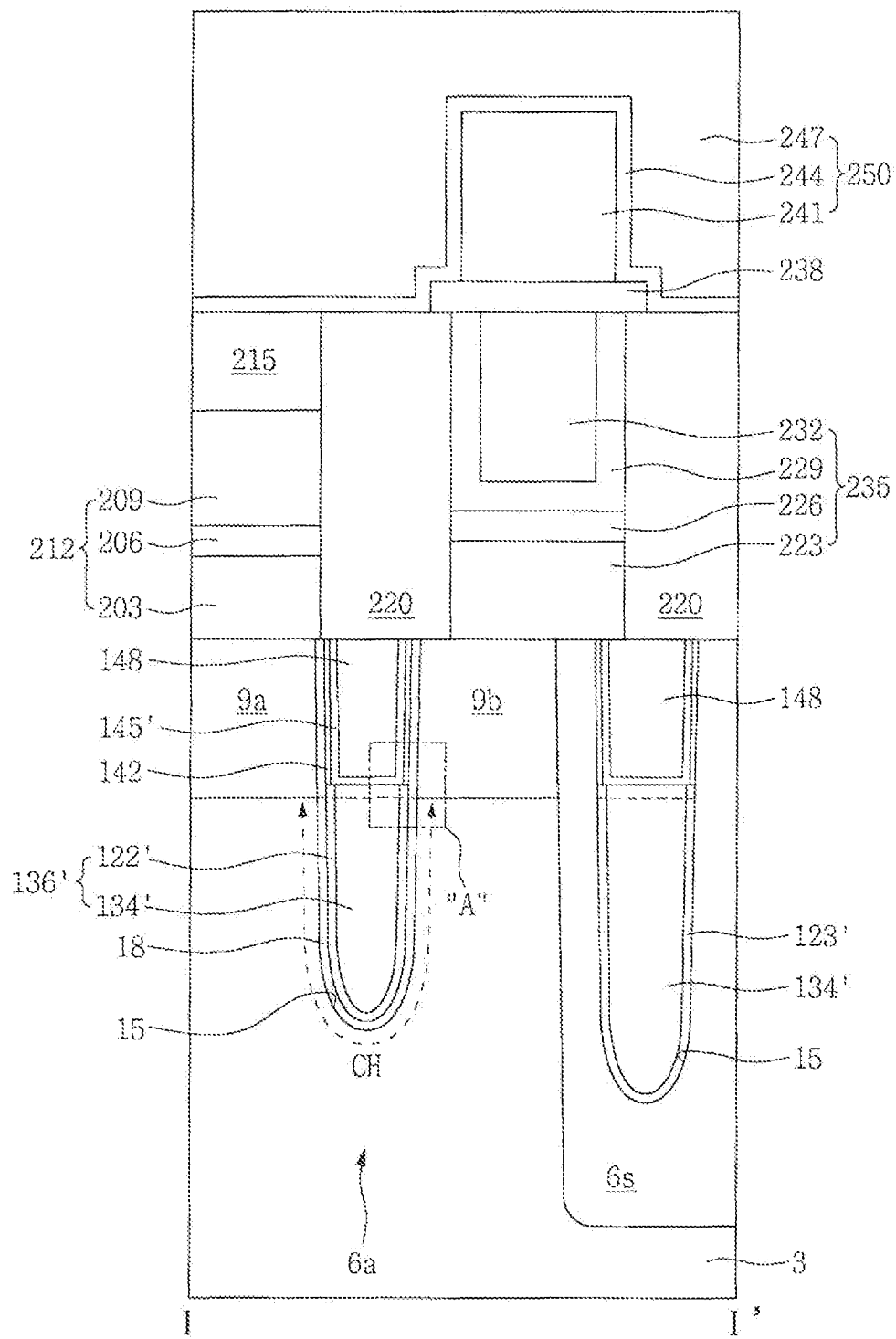
FIG. 7A is a cross-sectional view illustrating an example of a semiconductor device in accordance with an embodiment of the inventive concept.
Figure 7B:
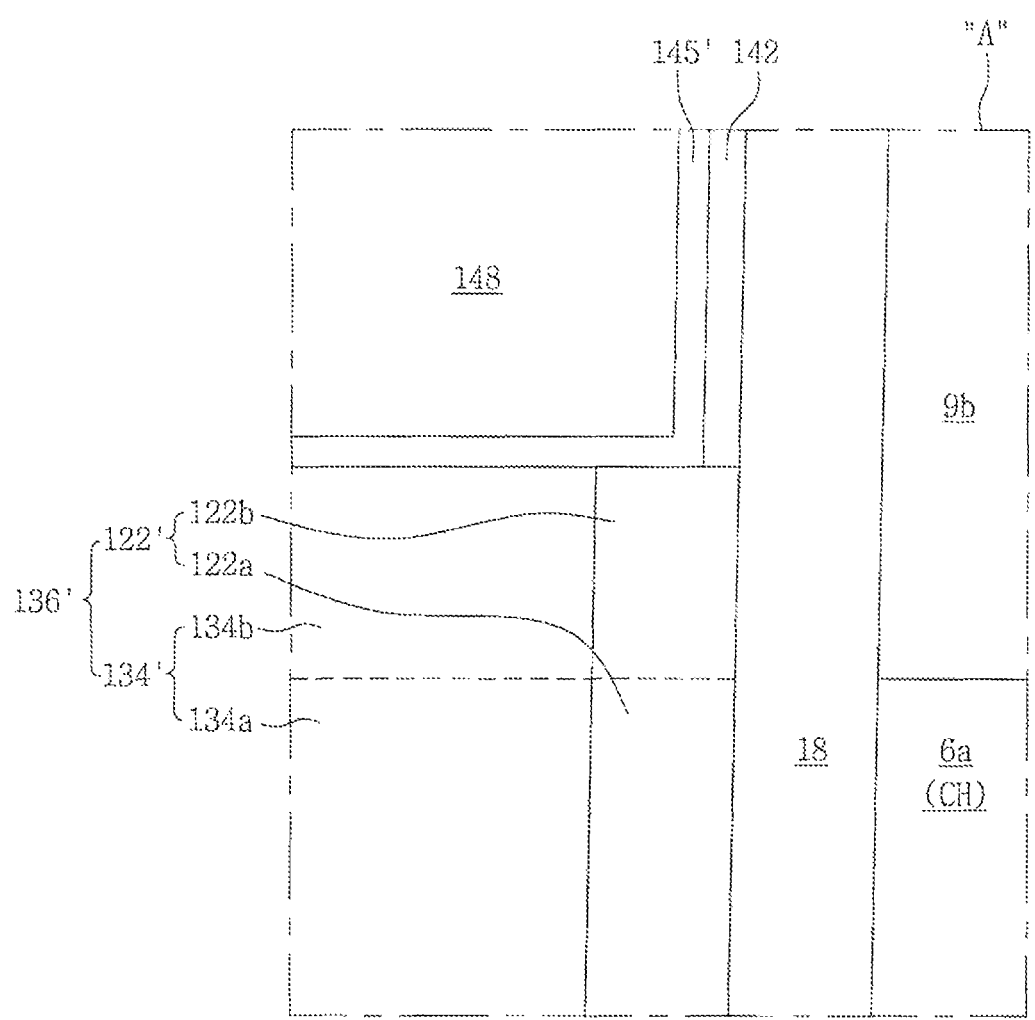
FIG. 7B is a partially enlarged view of a portion A of FIG. 7A.
Figure 8A:
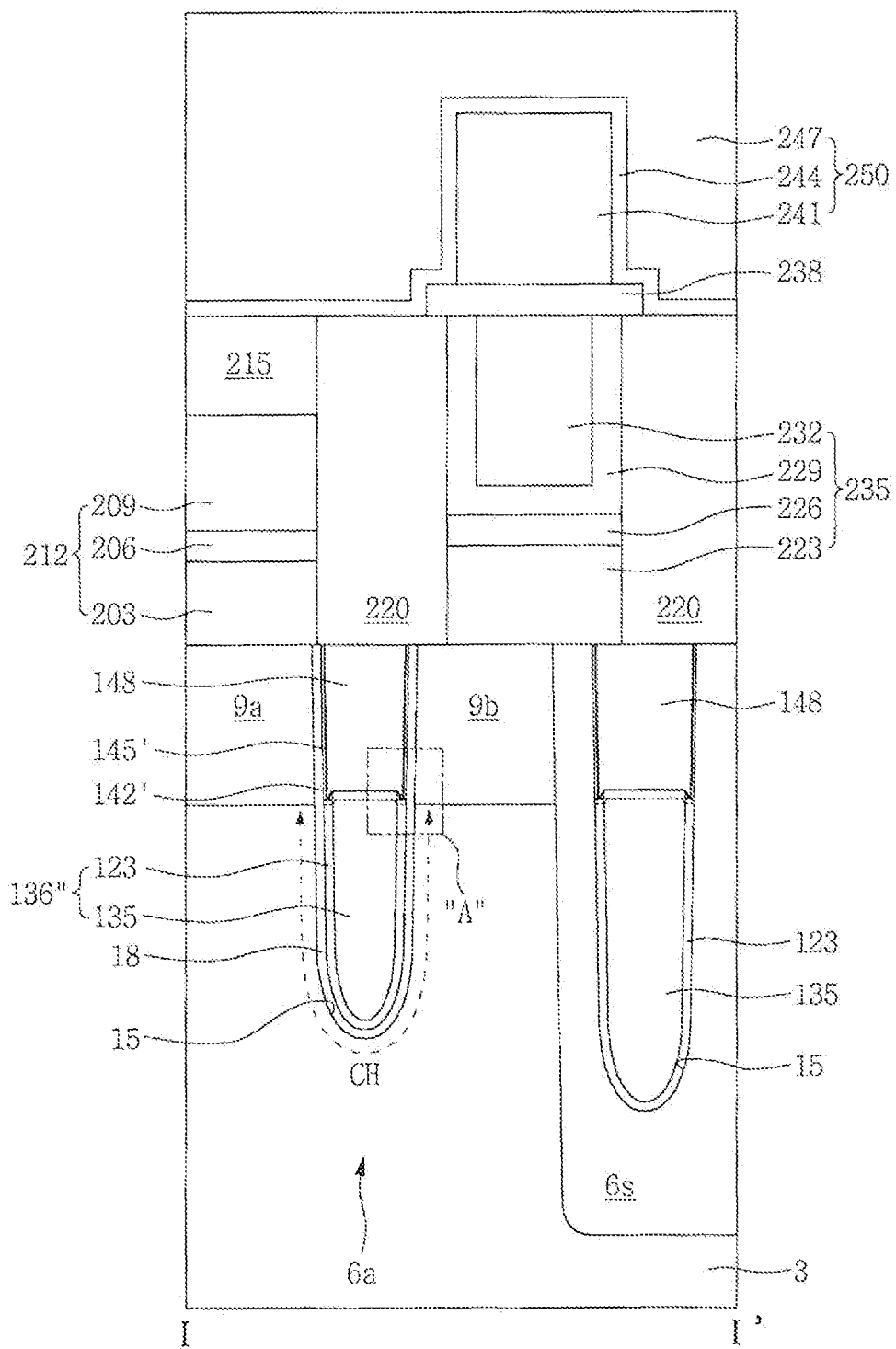
FIG. 8A is a cross-sectional view illustrating an example of a semiconductor device in accordance with an embodiment of the inventive concept.
Figure 8B:
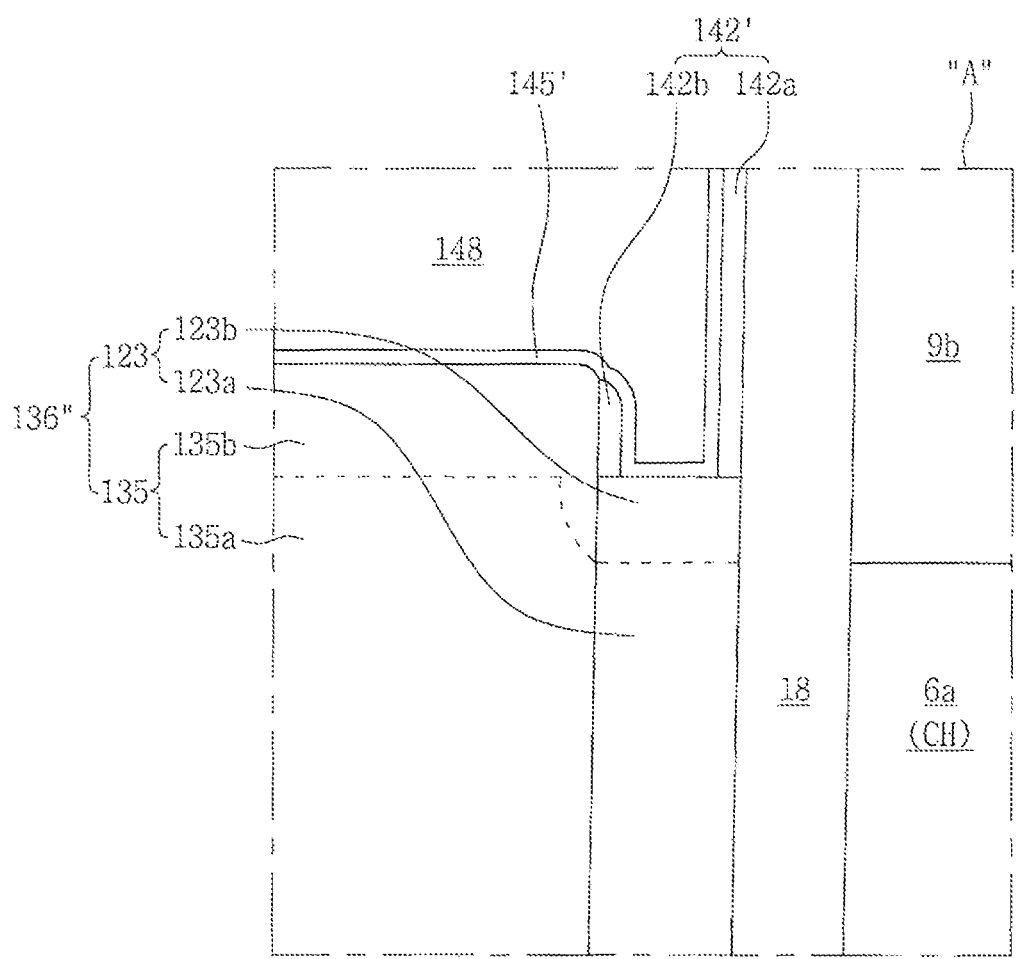
FIG. 8B is a partially enlarged view of a portion A of FIG. 8A.

FIG. 3A is a cross-sectional view illustrating an example of a semiconductor device in accordance with an embodiment of the inventive concept, and FIG. 3B is a partially enlarged view of a portion A of FIG. 3A. FIG. 4A is a cross-sectional view illustrating an example of a semiconductor device in accordance with an embodiment of the inventive concept, and FIG. 4B is a partially enlarged view of a portion A of FIG. 4A. FIG. 5A is a cross-sectional view illustrating an example of a semiconductor device in accordance with an embodiment of the inventive concept, and FIG. 5B is a partially enlarged view of a portion A of FIG. 5A. FIG. 6A is a cross-sectional view illustrating an example of a semiconductor device in accordance with an embodiment of the inventive concept, and FIG. 6B is a partially enlarged view of a portion A of FIG. 6A. FIG. 7A is a cross-sectional view illustrating an example of a semiconductor device in accordance with an embodiment of the inventive concept, and FIG. 7B is a partially enlarged view of a portion A of FIG. 7A. FIG. 8A is a cross-sectional view illustrating an example of a semiconductor device in accordance with an embodiment of the inventive concept, and FIG. 8B is a partially enlarged view of a portion A of FIG. 8A. FIGS. 2A, 3A, 4A, 5A, 6A, 7A, and 8A are cross-sectional views illustrating a region taken along line I-I' of FIG. 1.

First, an example of a semiconductor device in accordance with an embodiment of the inventive concept will be described with reference to FIGS. 1, 2A, and 2B.

Referring to FIGS. 1, 2A, and 2B, a semiconductor substrate 3 may be provided. The semiconductor substrate 3 may be a silicon-containing semiconductor. For example, the semiconductor substrate 3 may be a single-crystal silicon substrate.

A field region 6s may be disposed in the semiconductor substrate 3 to define an active region 6a. The field region 6s may be a shallow trench isolation (STI). For example, the field region 6s may include a field trench formed in the semiconductor substrate 3 and an insulating material, which fills the field trench. The active region 6a may be a first conductivity type. The first conductivity type may be a P-type conductivity type or an N-type conductivity type.

A gate trench 15 may be formed in the semiconductor substrate 3. The gate trench 15 may cross the active region 6a and extend into the field region 6s. In the gate trench 15, a bottom of a portion located in the active region 6a may be located at a higher level than a bottom of a portion located in the field region 6s.

A first source/drain region 9a and a second source/drain region 9b may be disposed in the active region 6a located at both sides of the gate trench 15. The first source/drain region 9a and the second source/drain region 9b may be spaced apart from each other.

A gate electrode 36 and a gate capping pattern 39 may be disposed in the gate trench 15 to be sequentially stacked. The gate capping pattern 39 may be formed of silicon nitride. The gate electrode 36 may partially fill the gate trench 15. An upper surface of the gate electrode 36 may be formed at a lower level than an upper surface of the active region 6a.

The gate electrode 36 may include a doped material layer 22 and a conductive material layer 34 formed on the doped material layer 22. The doped material layer 22 may cover side surfaces and a bottom surface of the conductive material layer 34. The doped material layer 22 may be formed to have a generally uniform thickness.

The doped material layer 22 may be formed of a metal nitride with which a first element is doped. The metal nitride may include a material, such as TiN, WN, or the like. The first element may be an element on a periodic table of elements, which may be doped in the metal nitride to change a work function of the metal nitride. For example, when the active region 6a is a P-type conductivity type and the first and second source/drain regions 9a and 9b each are an N-type conductivity type, the first element included in the doped material layer 22 may be "La." However, the inventive concept is not limited to "La," and may include any element as long as it can change the work function of the metal nitride. The conductive material layer 34 may be formed of a metal having a lower resistivity than the doped material layer 22, for example, tungsten. The conductive material layer 34 may not include the first element.

In an example of the semiconductor device in accordance with an embodiment of the inventive concept, the gate electrode 36 may include the doped material layer 22 capable of improving a threshold voltage characteristic of a transistor and the conductive material layer 34 capable of improving an electrical resistance characteristic.

A gate dielectric 18 may be disposed on an inner wall of the gate trench 15. The gate dielectric 18 may be formed on a surface of the active region 6a exposed by the gate trench 15. The gate dielectric 18 may be formed of silicon oxide or silicon oxide containing nitrogen. The gate dielectric 18 may be interposed between the gate electrode 36 and the active region 6a and between the gate capping pattern 39 and the active region 6a. The gate dielectric 18 may be in contact with the doped material layer 22. The doped material layer 22 may include the first element and the gate dielectric 18 may not include the first element.

The formation of the doped material layer 22 may include forming a source material layer including the first element on a first conductive material layer not including the first element, diffusing the first element included in the source material layer into the first conductive material layer by performing a thermal treatment process, changing an effective work function of the first conductive material layer, and removing the source material layer. Therefore, the doped material layer 22 may be the first conductive material layer with which the first element is doped.

In an example, in a case of an NMOS transistor, the first element may be an element on a periodic table of elements, such as La or the like, which may be diffused into the first conductive material layer to change the effective work function of the first conductive material layer. Therefore a semiconductor device having the gate electrode 36 capable of improving a threshold voltage characteristic of a transistor can be provided.

The source material layer for supplying the first element into the first conductive material layer may be formed so as not to be directly in contact with the gate dielectric 18. Further, the first element included in the source material layer may be diffused into the first conductive material layer using a thermal treatment process. Therefore, the first element may not be diffused into the gate dielectric 18. By the process in which the first element is diffused into the first conductive material layer to form the doped material layer 22, the characteristic of the gate dielectric 18 may not be changed and/or the reliability thereof may not be degraded.

A bit line structure 212 and a bit line capping pattern 215 may be disposed on the first source/drain region 9a and are sequentially stacked. The bit line structure 212 may include a bit line contact portion 203 physically and/or electrically connected to the first source/drain region 9a and an interconnection portion 209 formed on the bit line contact portion 203. The bit line structure 212 may include an intermediate portion 206 formed between the bit line contact portion 203 and the interconnection portion 209. In the bit line structure 212, the bit line contact portion 203 may be formed of polysilicon, the interconnection portion 209 may be formed of a metal, such as tungsten, or the like, and the intermediate portion 206 may be formed of a material including a metal silicide and/or a metal nitride. The bit line capping pattern 215 may be formed of an insulating material, such as silicon nitride or the like.

An interlayer insulating layer 220 may be disposed on side surfaces of the bit line structure 212 and the bit line capping pattern 215. A contact structure 235 may be disposed to pass through the interlayer insulating layer 220 and to be physically and/or electrically connected to the second source/drain region 9b.

The contact structure 235 may include a lower contact pattern 223, a metal silicide layer 226 formed on the lower contact pattern 223, an upper contact pattern 232 formed on the metal silicide layer 226, and a conductive barrier layer 229, which covers side surfaces and a bottom surface of the upper contact pattern 232. The lower contact pattern 223 may be formed of polysilicon. The upper contact pattern 232 may be formed of a metal material. The conductive barrier layer 229 may include a metal nitride.

A conductive pad 238 may be disposed on the contact structure 235. A data storage element 250 capable of storing data may be disposed on the conductive pad 238. For example, in a case of a dynamic random access memory (DRAM) device, the data storage element 250 may be a DRAM cell capacitor. For example, the data storage element 250 may include a first electrode 241 formed on the conductive pad 238, a capacitor dielectric 244 formed on the first electrode 241, and a second electrode 247 formed on the capacitor dielectric 244. However, the inventive concept is not limited to a DRAM device, and may be applied to another memory device, for example, a memory device, such as a magnetoresistive RAM (MRAM) device or the like.

The inventive concept is not limited to the gate electrode 36 described with reference to FIGS. 2A and 2B, and may include a gate electrode 36' as disclosed in FIGS. 3A and 3B. The gate electrode 36' will be described with reference to FIGS. 3A and 3B.

Referring to FIGS. 3A and 3B, the gate electrode 36' may include a doped material layer 22' and a conductive material layer 34, of which upper end portions have different heights. The upper end portion of the doped material layer 22' may be formed at a lower level than the upper end portion of the conductive material layer 34. Therefore, leakage current due to electric field concentration caused by a corner edge of the gate electrode 36', for example, gate induced drain leakage (GIDL) can be reduced.

The inventive concept is not limited to the gate dielectric 18 described with reference to FIGS. 2A and 2B, and may include a gate dielectric 18' as disclosed in FIGS. 4A and 4B. The gate dielectric 18' will be described with reference to FIGS. 4A and 4B.

Referring to FIGS. 4A and 4B, the gate dielectric 18' may include at least two layers. For example, the gate dielectric 18' may include a first gate dielectric 17a and a second gate dielectric 17b.

The first gate dielectric 17a may be formed by thermal oxidation of the active region 6a exposed by the gate trench 15. The second gate dielectric 17b may be conformally formed along an inner wall of the gate trench 15. The second gate dielectric 17b may cover the first gate dielectric 17a and may conformally cover the inner wall of the gate trench 15 located in the field region 6s.

The second gate dielectric 17b may include a high-k dielectric having higher permittivity than silicon oxide. The second gate dielectric 17b may be a film deposited using an atomic layer deposition (ALD) process. The second gate dielectric 17b may be SiON or an oxide including a metal element.

The inventive concept is not limited to the gate dielectric 18 and the gate electrode 36 described with reference to FIGS. 2A and 2B, and may include a gate dielectric 18' and a gate electrode 36' as disclosed in FIGS. 5A and 5B. The gate dielectric 18' and the gate electrode 36' will be described with reference to FIGS. 5A and 5B.

Referring to FIGS. 5A and 5B, the gate dielectric 18' may include the first gate dielectric 17a and the second gate dielectric 17b as described with reference to FIGS. 4A and 4B. The gate electrode 36' may include the doped material layer 22' and the conductive material layer 34 as described with reference to FIGS. 3A and 3B.

Next, an example of a semiconductor device in accordance with an embodiment of the inventive concept will be described with reference to FIGS. 6A and 6B.

Referring to FIGS. 6A and 6B, the active region 6a, the field region 6s, the gate trench 15, the gate dielectric 18, the first and second source/drain regions 9a and 9b, the bit line structure 212, the contact structure 235, the conductive pad 238 and the data storage element 250, which are substantially the same as those described with reference to FIGS. 2A and 2B, may be provided.

A gate electrode 136, a gate capping pattern 148, a source material layer 145, and an insulating buffer spacer 142 may be disposed in the gate trench 15.

The gate electrode 136 may partially fill the gate trench 15. The gate capping pattern 148 may be disposed on the gate electrode 136.

The source material layer 145 may be disposed between the gate electrode 136 and the gate capping pattern 148 and may cover side surfaces of the gate capping pattern 148. The insulating buffer spacer 142 may be disposed between the gate capping pattern 148 and an inner wall of the gate trench 15. The insulating buffer spacer 142 may be interposed between the source material layer 145 and the gate dielectric 18 to separate the source material layer 145 from the gate dielectric 18.

The gate electrode 136 may include a first doped material layer 122 and a second doped material layer 134 formed on the first doped material layer 122.

The first doped material layer 122 may be in contact with the gate dielectric 18 and conformally formed. The first doped material layer 122 may cover side surfaces and a bottom surface of the second doped material layer 134. The first doped material layer 122 may be formed of a material with which a first element is doped in a metal nitride, and the second doped material layer 134 may be formed of a material with which the first element is doped in a metal material.

In a case of an NMOS transistor, the first doped material layer 122 may be formed of the same material as the doped material layer 22 described with reference to FIGS. 2A and 2B, for example, a material with which a first element, such as "La" or the like, is doped in a metal nitride, such as TiN, WN, or the like, and having a lower effective work function than the metal nitride. The second doped material layer 134 may be formed of a material with which the first element, such as "La" or the like, is doped in a metal material, such as tungsten or the like. The source material layer 145 may be formed of a material including the first element. For example, the source material layer 145 may be formed of a material including "La," for example, a metal oxide such as LaO or the like.

The insulating buffer spacer 142 may be interposed between the source material layer 145 and the gate dielectric 18 and may prevent the source material layer 145 from being directly in contact with the gate dielectric 18. The insulating buffer spacer 142 may be formed of a high-k dielectric. For example, the insulating buffer spacer 142 may be formed of a material, such as HfSiON or the like.

The inventive concept is not limited to the gate electrode 136 and the source material layer 145 described with reference to FIGS. 6A and 6B, and may include a gate electrode 136' and a source material layer 145' as disclosed in FIGS. 7A and 7B. The gate electrode 136' and the source material layer 145' will be described with reference to FIGS. 7A and 7B.

Referring to FIGS. 7A and 7B, the gate electrode 136' may include a partially doped first conductive material layer 122' and a partially doped second conductive material layer 134'.

The first conductive material layer 122' may include a first portion 122a, which is formed as a metal nitride layer and is not doped, and a second portion 122b with which a first element is doped in the metal nitride layer. In the first conductive material layer 122', the second portion 122b may be disposed on the first portion 122a. The metal nitride layer may be a material, such as TiN, WN, or the like. The first element may be an element that may change, for example, may lower a work function of the metal nitride layer. For example, the first element may be an element, such as "La" or the like.

The second conductive material layer 134' may include a first portion 134a which is formed as a metal layer and is not doped, and a second portion 134b with which the first element is doped in the metal layer. In the second conductive material layer 134', the second portion 134b may be disposed on the first portion 134a. The metal layer may be a material, such as tungsten or the like. Therefore, the second portions 122b and 134b of the first and second conductive material layers 122' and 134' may be formed by being commonly doped with the first element.

The source material layer 145' may serve as a source capable of supplying the first element to the second portions 122b and 134b of the first and second conductive material layers 122' and 134'. The source material layer 145' may be formed to have a smaller thickness than the first conductive material layer 122'.

The inventive concept is not limited to the gate electrode 136' and the insulating buffer spacer 142 described with reference to FIGS. 7A and 7B, and may include a gate electrode 136" and an insulating buffer spacer 142' as disclosed in FIGS. 8A and 8B. The gate electrode 136" and the insulating buffer spacer 142' will be described with reference to FIGS. 8A and 8B.

Referring to FIGS. 8A and 8B, the gate electrode 136" may include a first conductive material layer 123 and a second conductive material layer 135, of which upper end portions have different heights. The upper end portion of the first conductive material layer 123 may be formed at a lower level than the upper end portion of the second conductive material layer 135.

The first conductive material layer 123 may include a first portion 123a which is formed as a metal nitride layer and is not doped, and a second portion 123b with which a first element is doped in the metal nitride layer. In the first conductive material layer 123, the second portion 123b may be disposed on the first portion 123a. The metal nitride layer may be a material, such as TiN, WN, or the like. The first element may be an element that may change, for example, may lower a work function of the metal nitride layer. For example, the first element may be an element, such as "La" or the like.

The second conductive material layer 135 may include a first portion 135a, which is formed as a metal layer and is not doped and a second portion 135b with which the first element is doped in the metal layer. In the second conductive material layer 135, the second portion 135b may be disposed on the first portion 135a. The metal layer may be a material, such as tungsten or the like. Therefore, the second portions 123b and 135b of the first and second conductive material layers 123 and 135 may be formed by being commonly doped with the first element.

An insulating buffer spacer 142' may include a first buffer spacer 142a and a second buffer spacer 142b. The first buffer spacer 142a may be disposed on the first conductive material layer 123 of the gate electrode 136" and interposed between the gate dielectric 18 and the gate capping pattern 148. The second buffer spacer 142b may be disposed on the first conductive material layer 123 and on side surfaces of a portion protruding from the second conductive material layer 135.

Figure 10:
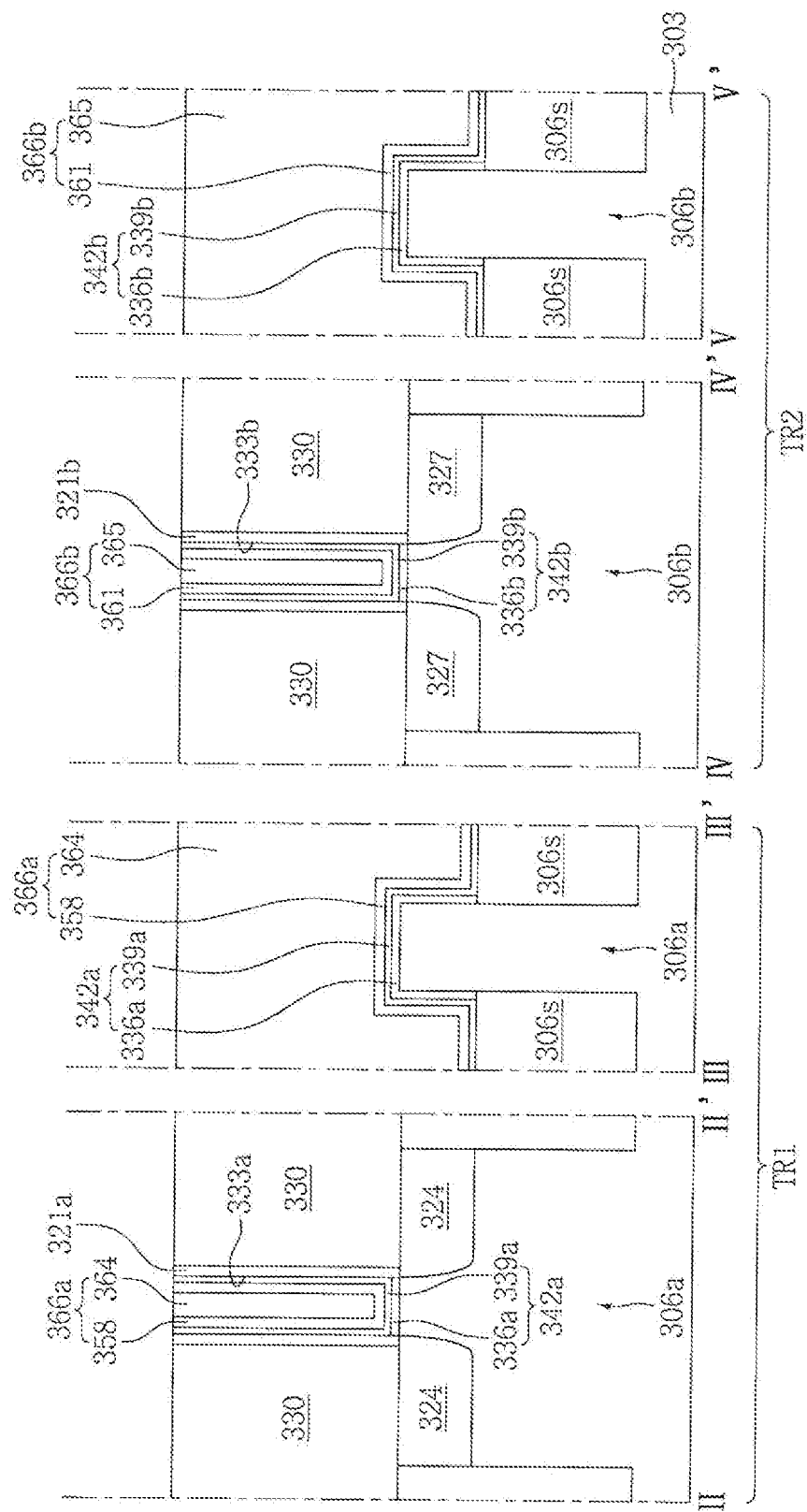
FIG. 10 is a cross-sectional view illustrating an example of a semiconductor device in accordance with an embodiment of the inventive concept.

Next, an example of a semiconductor device in accordance with an embodiment of the inventive concept will be described with reference to FIGS. 9 and 10. FIG. 9 is a plan view illustrating an example of a semiconductor device in accordance with an embodiment of the inventive concept. FIG. 10 is a cross-sectional view illustrating an example of a semiconductor device in accordance with an embodiment of the inventive concept. FIG. 10 is a cross-sectional view illustrating regions taken along lines II-II', III-III', IV-IV', and V-V' of FIG. 9.

Referring to FIGS. 9 and 10, a semiconductor substrate 303 having a first transistor region TR1 and a second transistor region TR2 may be provided. The first transistor region TR1 may be an NMOS transistor region, and the second transistor region TR2 may be a PMOS transistor region.

A field region 306s may be disposed to define a first active region 306a disposed in the first transistor region TR1 of the semiconductor substrate 303 and a second active region 306b disposed in the second transistor region TR2 of the semiconductor substrate 303. The field region 306s may be an STI. The first and second active regions 306a and 306b may be different conductivity types.

In an example, each of the first and second active regions 306a and 306b may be formed in a fin active structure having a portion protruding from the field region 306s.

A first gate electrode 366a may be disposed on the first transistor region TR1 of the semiconductor substrate 303. A second gate electrode 366b may be disposed on the second transistor region TR2 of the semiconductor substrate 303.

The first gate electrode 366a may cross the first active region 306a and extend onto the field region 306s, and the second gate electrode 366b may cross the second active region 306b and extend onto the field region 306s.

The first gate electrode 366a may overlap or face an upper surface and side surfaces of the protruding portion of the first active region 306a, and the second gate electrode 366b may overlap or face an upper surface and side surfaces of the protruding portion of the second active region 306b.

The first gate electrode 366a may include a first doped material layer 358 and a first conductive material layer 364, and the second gate electrode 366b may include a second doped material layer 361 and a second conductive material layer 365.

The first doped material layer 358 may conformally cover a bottom surface and side surfaces of the first conductive material layer 364, and the second doped material layer 361 may conformally cover a bottom surface and side surfaces of the second conductive material layer 365. The first and second conductive material layers 364 and 365 may be formed of the same metal material, for example, tungsten.

The first and second doped material layers 358 and 361 may be formed of conductive materials having different work functions. For example, the first doped material layer 358 may be formed of a metal nitride with which a first element, such as La or the like, is doped, and the second doped material layer 361 may be formed of a metal nitride with which a second element, such as Al, Hf, Zr or the like, is doped. Therefore, the first and second gate electrodes 366a and 366b may have different work functions. The first doped material layer 358 may include the first element, the second doped material layer 361 may include the second element, and the first and second conductive material layers 364 and 365 may not include the first element and the second element.

A first gate dielectric 342a and a second gate dielectric 342b may be disposed on the first and second active regions 306a, 306b. The first gate dielectric 342a may include a first lower gate dielectric 336a interposed between the first gate electrode 366a and the first active region 306a and a first upper gate dielectric 339a, which is disposed on the first lower gate dielectric 336a and covers a bottom surface and side surfaces of the first gate electrode 366a. The first lower gate dielectric 336a may include a thermal oxide grown from the first active region 306a. The first upper gate dielectric 339a may be formed of a dielectric formed using a deposition process, such as an ALD process, for example, a high-k dielectric having a higher dielectric constant than silicon oxide.

The second gate dielectric 342b may include a second lower gate dielectric 336b interposed between the second gate electrode 366b and the second active region 306b and a second upper gate dielectric 339b, which is disposed on the second lower gate dielectric 336b and covers a bottom surface and side surfaces of the second gate electrode 366b. The second lower gate dielectric 336b may include a thermal oxide grown from the second active region 306b. The second upper gate dielectric 339b may be formed of a dielectric formed using a deposition process, such as an ALD process, for example, a high-k dielectric having a higher dielectric constant than silicon oxide.

An interlayer insulating layer 330 may be disposed on the semiconductor substrate 303. The first and second gate electrodes 366a and 366b may pass through the interlayer insulating layer 330.

An insulating first gate spacer 321a may be disposed between side surfaces of the first gate electrode 366a and the interlayer insulating layer 330, and an insulating second gate spacer 321b may be disposed between side surfaces of the second gate electrode 366b and the interlayer insulating layer 330.

First source/drain regions 324 may be disposed in the first active region 306a located at both sides of the first gate electrode 366a, and second source/drain regions 327 may be disposed in the second active region 306b located at both sides of the second gate electrode 366b.

The first gate electrode 366a, the first gate dielectric 342a, and the first source/drain regions 324 may constitute a first transistor, and the second gate electrode 366b, the second gate dielectric 342b and the second source/drain regions 327 may constitute a second transistor.

Next, an example of a method of forming the structure of the semiconductor device described with reference to FIGS. 1, 2A, and 2B will be described with reference to FIGS. 11 to 17. FIGS. 11 to 17 are cross-sectional views illustrating a region taken along line of I-I' of FIG. 1.

Figure 11:
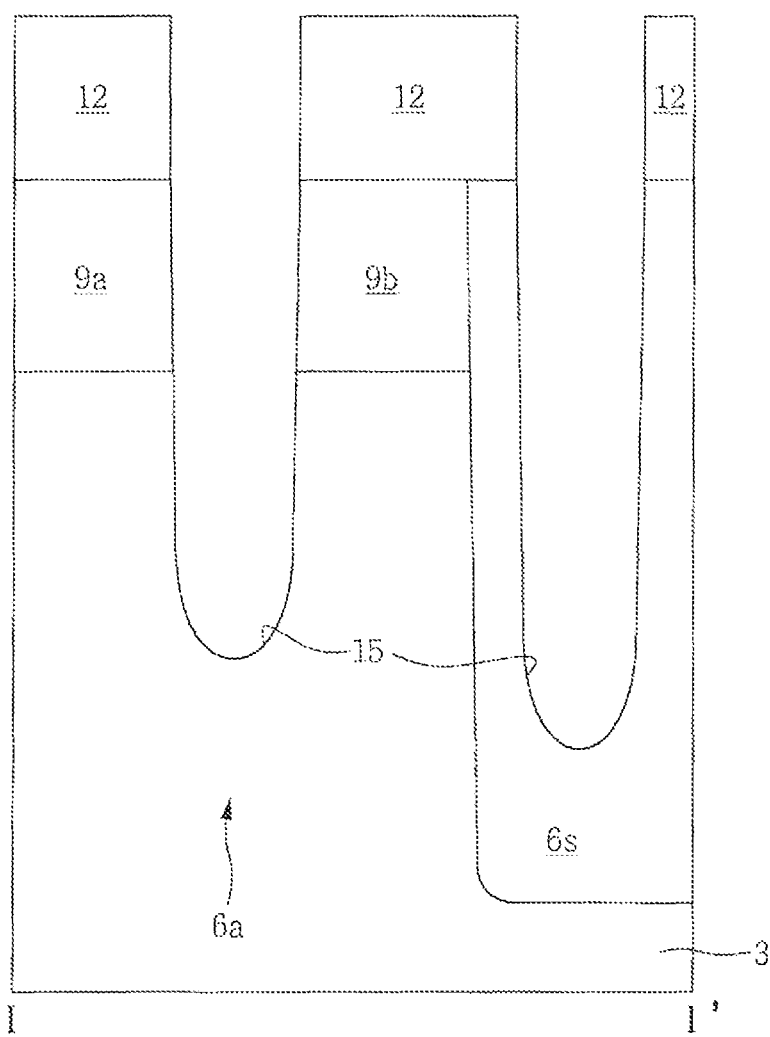
FIGS. 11 to 17 are cross-sectional views illustrating an example of a method of forming a semiconductor device in accordance with an embodiment of the inventive concept.

Referring to FIGS. 1 and 11, a semiconductor substrate 3 may be provided. The semiconductor substrate 3 may be a silicon-containing semiconductor. For example, the semiconductor substrate 3 may be a single-crystal silicon substrate. A field region 6s may be formed in the semiconductor substrate 3 to define an active region 6a. The field region 6s may be an STI. For example, the formation of the field region 6s may include forming a field trench in the semiconductor substrate 3 and forming an insulating material that fills the field trench.

By performing a source/drain ion implantation process, a first source/drain region 9a and a second source/drain region 9b may be formed in the active region 6a. The first and second source/drain regions 9a and 9b may be a conductivity type opposite to the active region 6a. For example, the active region 6a may be a P-type conductivity type and the first and second source/drain regions 9a and 9b each may be an N-type conductivity type.

A gate mask 12 may be formed on the semiconductor substrate 3 having the active region 6a and the field region 6s. The gate mask 12 may include a material having an etch selectivity with respect to a material constituting the active region 6a and a material constituting the field region 6s.

A gate trench 15 may be formed by etching the active region 6a and the field region 6s using the gate mask 12 as an etch mask. The gate trench 15 may cross the active region 6a and extend into the field region 6s. In the gate trench 15, a portion formed in the field region 6s may be formed to have a greater depth than a portion formed in the active region 6a. For example, when the active region 6a and the field region 6s are etched using the gate mask 12 as an etch mask to form the gate trench 15, the field region 6s may be etched to have a greater depth than the active region 6a. Therefore, in a bottom surface of the gate trench 15, side surfaces of the active region 6a may be exposed. The gate trench 15 may pass between the first source/drain region 9a and the second source/drain region 9b and separate the first source/drain region 9a from the second source/drain region 9b.

Figure 12:
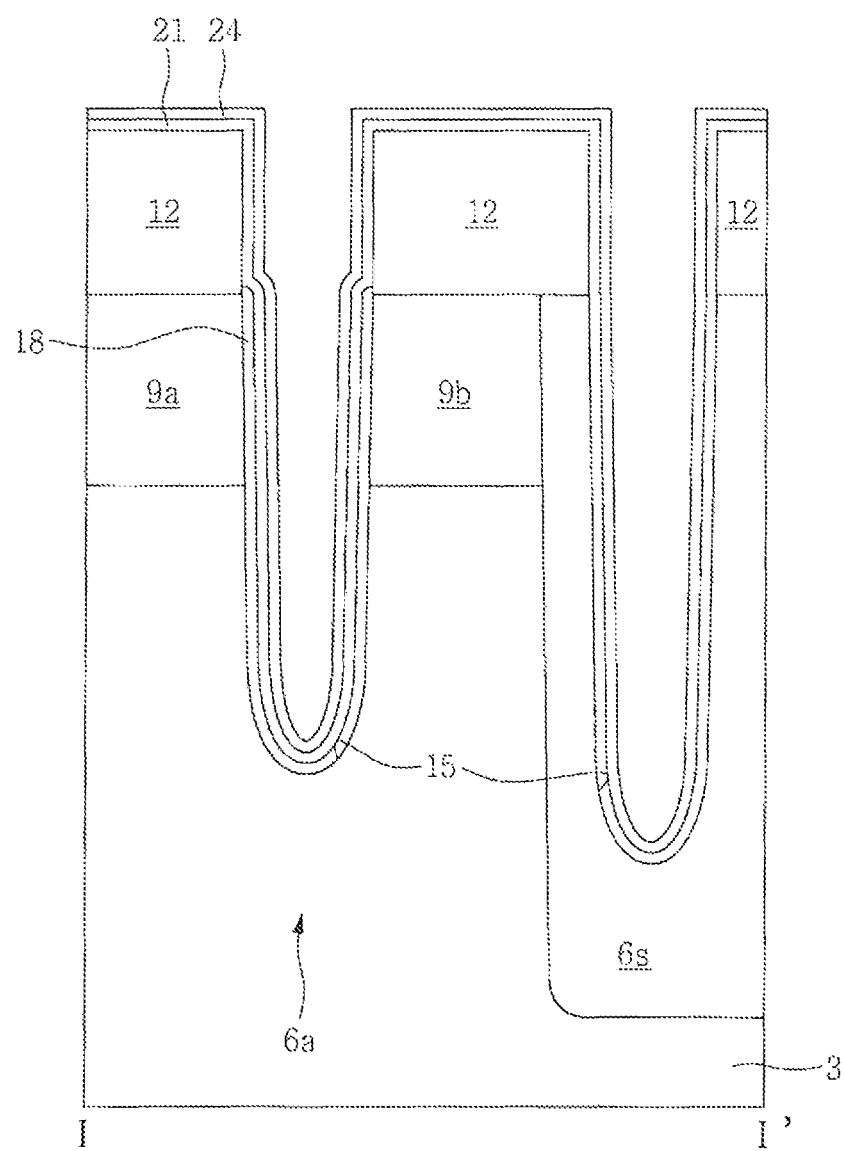

Referring to FIGS. 1 and 12, a gate dielectric 18 may be formed on the semiconductor substrate 3 having the gate trench 15. The gate dielectric 18 may be formed on the active region 6a exposed by the gate trench 15. The gate dielectric 18 may be formed on an inner wall of the gate trench 15. The gate dielectric 18 may be formed on a surface of the active region 6a exposed by the gate trench 15.

In an example, the formation of the gate dielectric 18 may include forming an oxide on the active region 6a exposed by the gate trench 15 by performing an oxidation process on the semiconductor substrate 3 having the gate trench 15. The oxidation process may include a thermal oxidation process.

The gate dielectric 18 may be formed of silicon oxide or silicon oxide containing nitrogen.

In an example, the formation of the gate dielectric 18 of the silicon oxide containing nitrogen may include forming silicon oxide on the active region 6a exposed by the gate trench 15 by performing a thermal oxidation process and doping nitrogen in the silicon oxide by performing a nitriding process on the silicon oxide.

A first conductive material layer 21 may be conformally formed on the semiconductor substrate 3 having the gate dielectric 18. The first conductive material layer 21 may be formed to cover the gate dielectric 18 so as to have a generally uniform thickness. The first conductive material layer 21 may be formed of a metal nitride, for example, TiN or WN.

A source material layer 24 may be formed on the first conductive material layer 21. The source material layer 24 may be formed of a material including a first element. The source material layer 24 may be a metal oxide including the first element. In an example, the first element may be a metal element. The first element may be an element on a periodic table of elements, which may change a work function of the first conductive material layer 21.

In a case of an NMOS transistor, the source material layer 24 may be formed of a material including LaO. The first element may be "La," which may lower the work function of the first conductive material layer 21. However, the inventive concept is not limited thereto. For example, a material including the element, which may lower the work function of the first conductive material layer 21, may be used as the source material layer 24 in accordance with an embodiment of the inventive concept.

Figure 13:
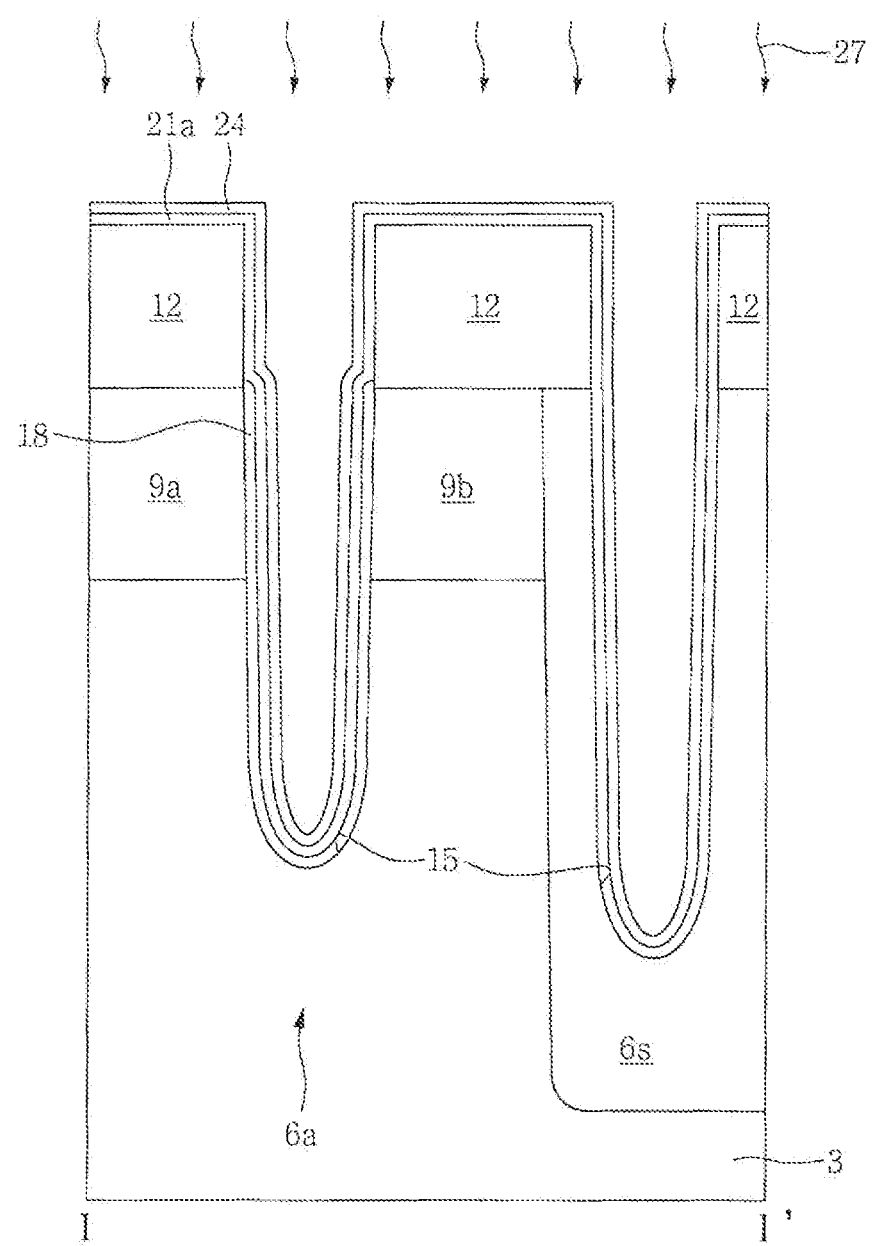

Referring to FIGS. 1 and 13, by performing a thermal treatment process 27, the first element included in the source material layer 24 may be diffused into the first conductive material layer 21 and, thus, the first conductive material layer 21 may be formed to be a doped material layer 21a.

In an example, in a case of an NMOS transistor, the doped material layer 21a may include the first element and may have a lower effective work function than the first conductive material layer 21 (illustrated FIG. 12).

Figure 14A:
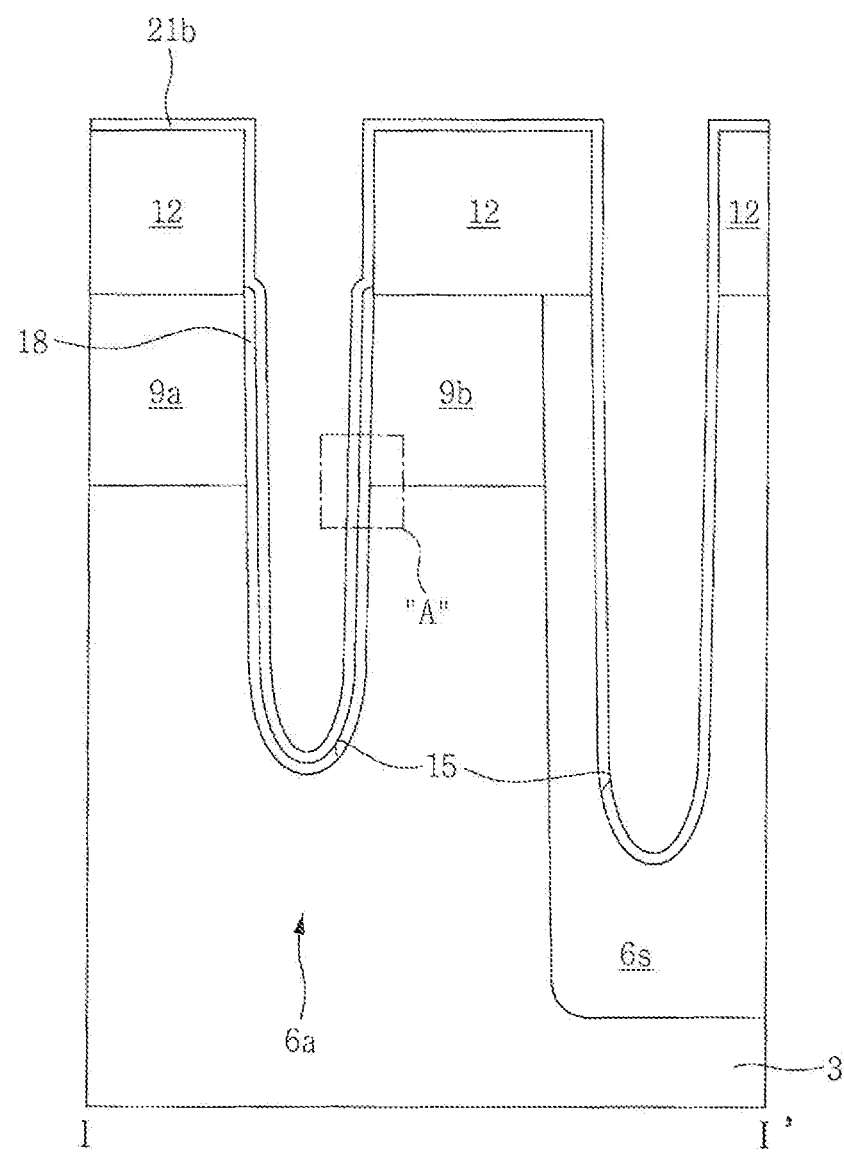
Figure 14B:
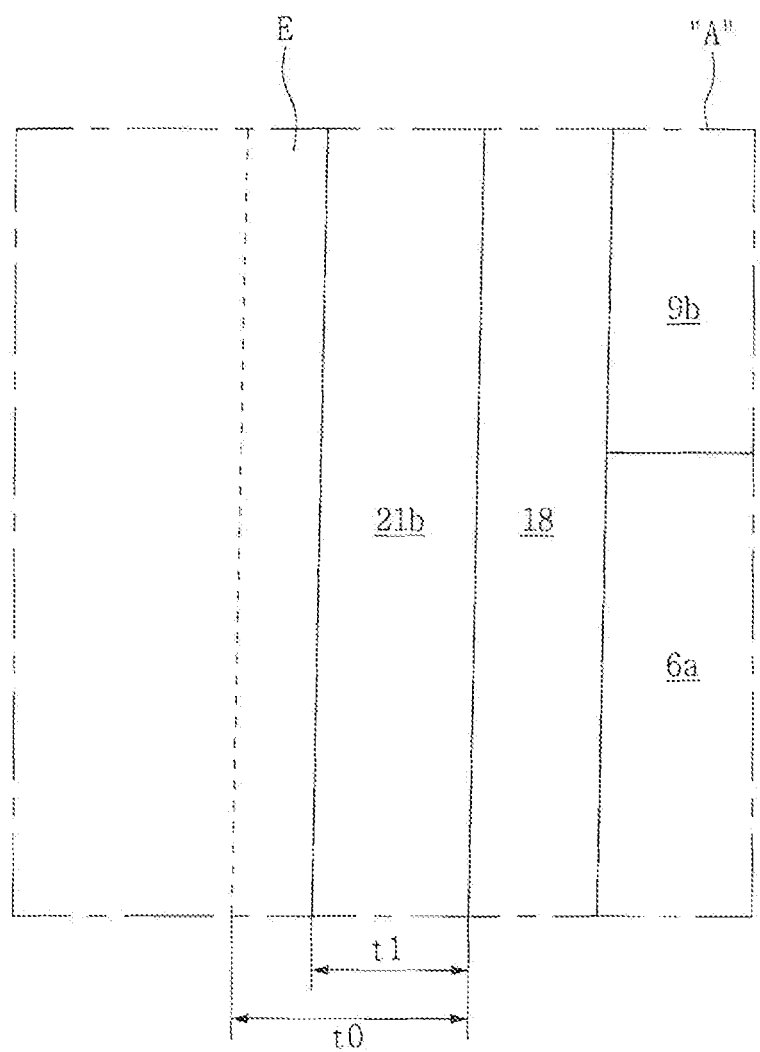

Referring to FIGS. 1, 14A, and 14B, the source material layer 24 (illustrated in FIG. 13) formed on the doped material layer 21a (illustrated in FIG. 13) may be removed by performing an etching process.

After the source material layer 24 (illustrated in FIG. 13) is removed, a doped material layer 21b of which a thickness is decreased may be formed. The formation of the doped material layer 21b of which the thickness is decreased may include partially etching the doped material layer 21a (illustrated in FIG. 13) and decreasing the thickness of the doped material layer 21a (illustrated in FIG. 13) after the source material layer 24 is removed. For example, after the source material layer 24 (illustrated FIG. 13) is removed, the doped material layer 21a (illustrated in FIG. 13) having a first thickness t0 may be partially etched to form the doped material layer 21b having a second thickness t1 smaller than the first thickness t0.

In FIG. 14B, a region represented by "E" may refer to a region in which the thickness of the doped material layer 21a (illustrated in FIG. 13) is decreased.

Figure 15:
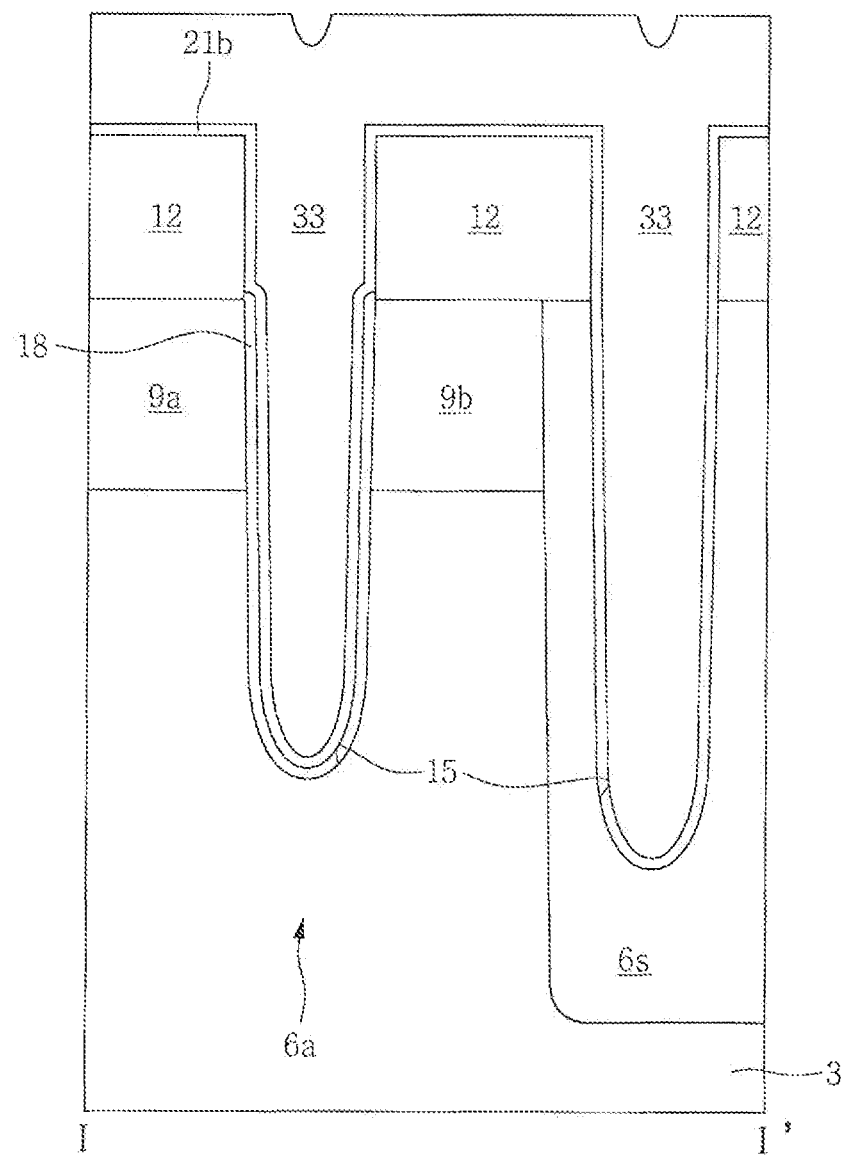

Referring to FIGS. 1 and 15, a second conductive material layer 33 may be formed on the doped material layer 21b of which the thickness is decreased. The second conductive material layer 33 may fill the gate trench 15. The second conductive material layer 33 may be formed of a metal having a lower resistivity than the doped material layer 21b. For example, the second conductive material layer 33 may include tungsten.

Figure 16:
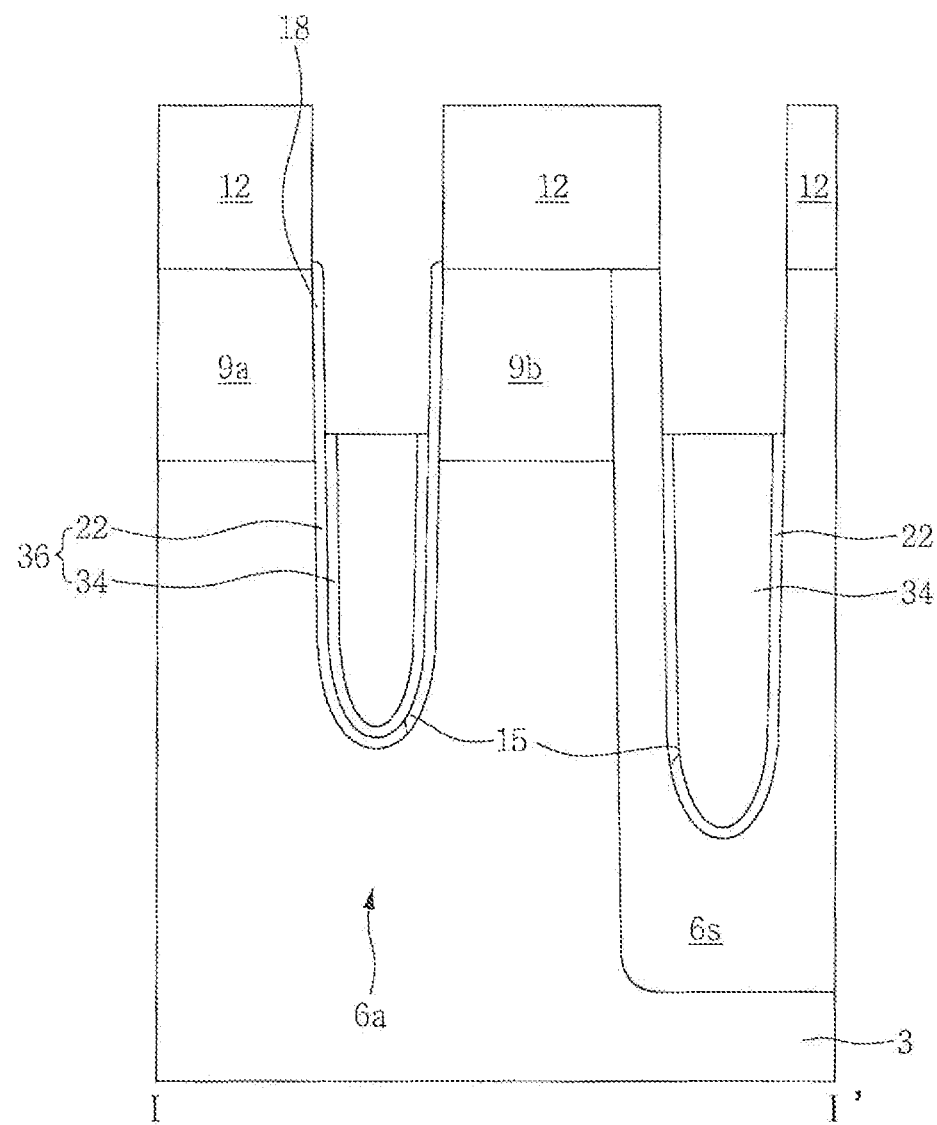

Referring to FIGS. 1 and 16, the second conductive material layer 33 (illustrated in FIG. 15) and the doped material layer 21b (illustrated in FIG. 15) may be partially etched, and then a gate electrode 36 having a partially etched conductive material layer 34 and a partially etched doped material layer 22 may be formed. The gate electrode 36 may partially fill the gate trench 15. An upper surface of the gate electrode 36 may be formed at a lower level than an upper surface of the active region 6a.

Figure 17:
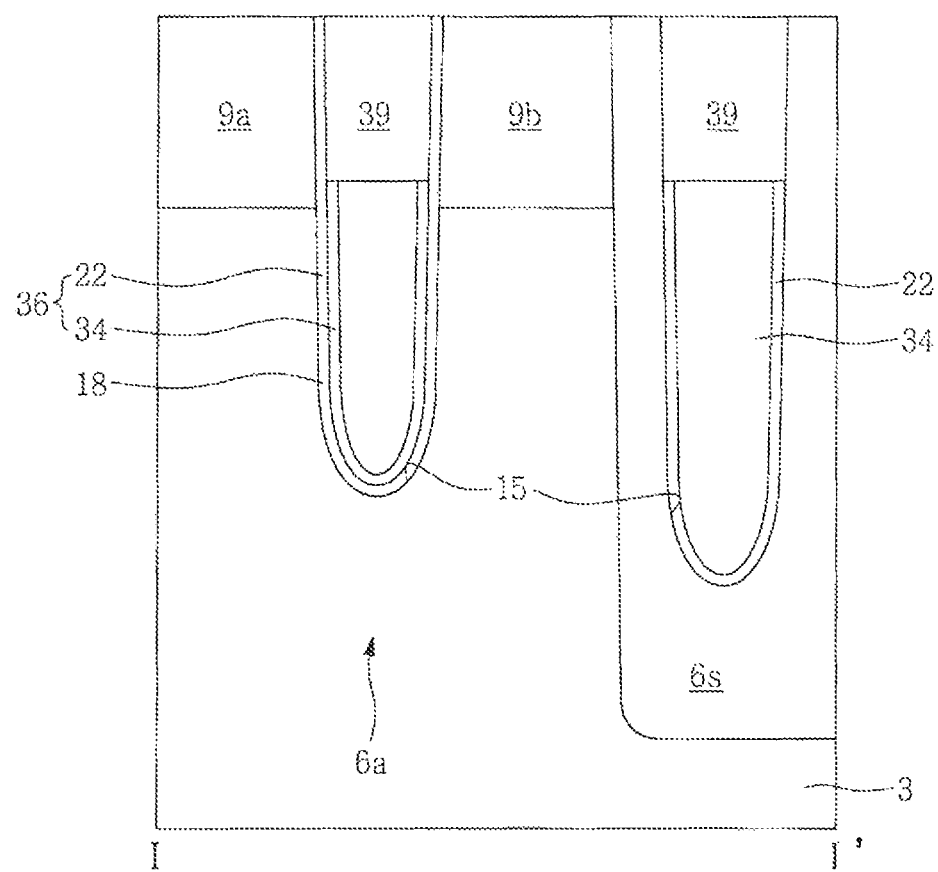

Referring to FIGS. 1 and 17, an insulating gate capping pattern 39 may be formed on the gate electrode 36 to fill remaining portions of the gate trench 15. The gate capping pattern 39 may be formed of silicon nitride.

In an example, the formation of the gate capping pattern 39 may include deposing an insulating material layer on the semiconductor substrate 3 having the gate electrode 36, planarizing the insulating material layer until the gate mask 12 (illustrated in FIG. 16) is exposed, and removing the gate mask 12 (illustrated in FIG. 16).

Referring to FIGS. 1, 2A, and 2B, a bit line structure 212 and a bit line capping pattern 215 formed on the bit line structure 212 may be formed on the first source/drain region 9a.

The bit line structure 212 may include a contact portion 203 physically and/or electrically connected to the first source/drain region 9a and an interconnection portion 209 formed on the contact portion 203. The bit line structure 212 may include the contact portion 203 and an intermediate portion 206 formed on the interconnection portion 209. In the bit line structure 212, the contact portion 203 may be formed of polysilicon, the interconnection portion 209 may be formed of a metal, such as tungsten or the like, and the intermediate portion 206 may be formed of a material including a metal silicide and/or a metal nitride. The bit line capping pattern 215 may be formed of an insulating material such as silicon nitride or the like.

An interlayer insulating layer 220 may be formed on side surfaces of the bit line structure 212 and the bit line capping pattern 215.

A contact structure 235 may be formed to pass through the interlayer insulating layer 220 and to be physically and/or electrically connected to the second source/drain region 9b. The contact structure 235 may include a lower contact pattern 223, a metal silicide layer 226 formed on the lower contact pattern 223, an upper contact pattern 232 formed on the metal silicide layer 226, and a conductive barrier layer 229, which covers the side surfaces and a bottom surface of the upper contact pattern 232. The lower contact pattern 223 may be formed of polysilicon. The upper contact pattern 232 may be formed of a metal material. The conductive barrier layer 229 may include a metal nitride.

A conductive pad 238 may be formed on the contact structure 235. A data storage element 250 capable of storing data may be formed on the conductive pad 238. For example, in a case of a DRAM device, the data storage element 250 may be a DRAM cell capacitor. For example, the data storage element 250 may include a first electrode 241 formed on the conductive pad 238, a capacitor dielectric 244 formed on the first electrode 241, and a second electrode 247 formed on the capacitor dielectric 244. However, the inventive concept is not limited to a DRAM device, and may be applied to other types of memory devices, for example, a memory device, such as an MRAM device or the like.

According to an embodiment of the inventive concept, a method of forming a semiconductor device having a gate and the semiconductor device manufactured by the method may be provided. The gate may include a gate dielectric 18 not including a first element and a gate electrode 36 including the first element. The gate electrode 36 may include a doped material layer 22 including the first element. The formation of the doped material layer 22 may include forming the source material layer 24 (illustrated in FIG. 12) including the first element on the first conductive material layer 21 (illustrated in FIG. 12) not including the first element, and diffusing the first element included in the source material layer 24 (illustrated in FIG. 12) into the first conductive material layer 21 (illustrated in FIG. 12) by performing the thermal treatment process 27 (illustrated in FIG. 13).

The first element included in the source material layer 24 (illustrated in FIG. 12) may be diffused into the first conductive material layer 21 (illustrated in FIG. 12) by the thermal treatment process 27 (illustrated in FIG. 13) to change an effective work function of the first conductive material layer 21 (illustrated in FIG. 12). For example, in a case of an NMOS transistor, the first element may be an element on a periodic table of elements, for example, La, which is diffused into the first conductive material layer 21 (illustrated in FIG. 12) to lower the effective work function of the first conductive material layer 21 (illustrated in FIG. 12). Therefore, the semiconductor device having the gate capable of improving a threshold voltage characteristic of a transistor can be provided.

The first conductive material layer 21 (illustrated in FIG. 12) may be formed to have a generally uniform thickness. Also, the source material layer 24 (illustrated in FIG. 12) may be formed to have a generally uniform thickness. Therefore, the first element included in the source material layer 24 (illustrated in FIG. 13) may be generally uniformly diffused from a surface of the first conductive material layer 21 (illustrated in FIG. 12) into the first conductive material layer 21 (illustrated in FIG. 12) by the thermal treatment process 27 (illustrated in FIG. 13) to form the doped material layer 21a (illustrated in FIG. 13) including the first element. Therefore, because the doped material layers 21a and 22 (illustrated in FIGS. 13 and 2A) each are formed to have a generally uniform property, a distribution characteristic of the semiconductor device can be improved.

The gate in accordance with an embodiment of the inventive may include the gate electrode 36 including the doped material layer 22 capable of improving a threshold voltage characteristic of a transistor, and the conductive material layer 34 having an improved electrical resistance characteristic, by including the first element. The conductive material layer 34 may not include the first element and may be formed of a metal material having a lower resistivity than the doped material layer 22, for example, W.

The source material layer 24 (illustrated in FIG. 12) for supplying the first element into the first conductive material layer 21 (illustrated in FIG. 12) may be formed so as not to be directly in contact with the gate dielectric 18 (illustrated in FIG. 12). Further, the first element included in the source material layer 24 (illustrated in FIG. 12) is diffused into the first conductive material layer 21 (illustrated in FIG. 12) using the thermal treatment process 27 (illustrated in FIG. 13), the first conductive material layer 21 (illustrated in FIG. 12) may formed to the doped material layer 24 (illustrated in FIG. 13) including the first element, and the first element may not be diffused into the gate dielectric 18 (illustrated in FIG. 13). Therefore, by the thermal treatment process 27 (illustrated in FIG. 13) in which the first element is diffused into the first conductive material layer 21 (illustrated in FIG. 12), the electrical characteristic of the gate dielectric 18 (illustrated in FIG. 13) may not be changed or the reliability thereof may not be degraded. That is, while the electrical characteristic and reliability of the gate dielectric 18 (illustrated in FIG. 13) are not degraded, the first element may be selectively diffused into the first conductive material layer 21 (illustrated in FIG. 12) to form the doped material layer 24 (illustrated in FIG. 13). Therefore, while the electrical characteristic and reliability of the gate dielectric 18 are not degraded, a method of changing an effective work function of a material of the gate electrode 36 in contact with the gate dielectric 18 can be provided.

Figure 18:
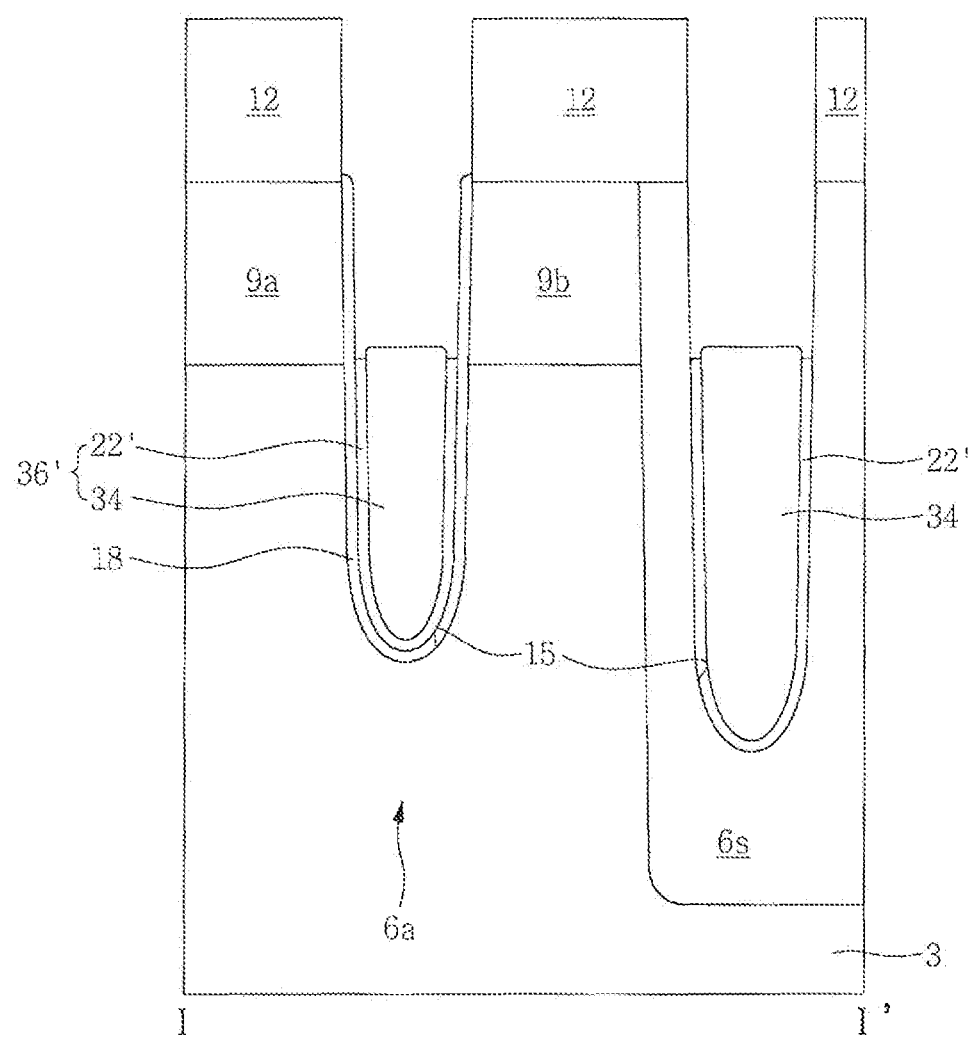
FIG. 18 is a cross-sectional view illustrating an example of a method of forming a semiconductor device in accordance with an embodiment of the inventive concept.

In an example of the method of forming the semiconductor device in accordance with an embodiment of the inventive concept, the method of forming the gate electrode 36 is not limited to the method described with reference to FIGS. 12 to 16. An example of a method of forming the gate electrode 36, according to some embodiments of the inventive concept, will be described with reference to FIG. 18. FIG. 18 is a cross-sectional view illustrating a region taken along line I-I' of FIG. 1.

Referring to FIG. 18, the semiconductor substrate 3 having the second conductive material layer 33 (illustrated in FIG. 15) may be provided using the same method as described with reference to FIGS. 11 to 15. Next, the second conductive material layer 33 (illustrated in FIG. 15) and the doped material layer 21b (illustrated in FIG. 15) may be partially etched to form a gate electrode 36' including a conductive material layer 34 formed by being partially etched and the doped material layer 22' formed by being partially etched. An upper end portion of the doped material layer 22' may be formed at a lower level than an upper end portion of the conductive material layer 34. Next, as described with reference to FIG. 17, the process of forming the insulating gate capping pattern 39 may be performed. Therefore, as described with reference to FIGS. 3A and 3B, the gate electrode 36' may be formed.

In an example of the method of forming the semiconductor device in accordance with an embodiment of the inventive concept, the method of forming the gate dielectric 18 is not limited to the method described with reference to FIG. 12. An example of a method of forming the gate dielectric 18 will be described with reference to FIGS. 4A and 4B.

Referring to FIGS. 4A and 4B, the semiconductor substrate 3 having the gate trench 15 (illustrated in FIG. 11) may be provided as described with reference to FIG. 11. Next, by performing a thermal oxidation process, the active region 6a exposed by the gate trench 15 may be oxidized to form a first gate dielectric 17a.

In an example, a process in which nitrogen is included in the first gate dielectric 17a, for example, a plasma nitriding process may also be performed.

By performing a deposition process, a second gate dielectric 17b may be conformally formed on the semiconductor substrate 3 having the first gate dielectric 17a. The second gate dielectric 17b may include a high-k dielectric having higher permittivity than silicon oxide. The second gate dielectric 17b may be a film deposited using an ALD process. The second gate dielectric 17b may be SiON or an oxide including a metal element.

Next, a process of forming the first conductive material layer 21 and the source material layer 24 described in FIG. 12 may be performed, and then a semiconductor process may be performed using the method described in FIGS. 13 to 17.

In an example of the method of forming the semiconductor device in accordance with an embodiment of the inventive concept, the method of forming the gate dielectric 18 and the gate electrode 36 is not limited to the method described with reference to FIGS. 12 to 16. An example of a method of forming the gate dielectric 18 and the gate electrode 36 will be described with reference to FIGS. 5A and 5B.

Referring to FIGS. 5A and 5B, the semiconductor substrate 3 having the gate trench 15 (illustrated in FIG. 11) may be provided as described in FIG. 11. Next, the active region 6a exposed by the gate trench 15 may be oxidized by performing a thermal oxidation process to form a first gate dielectric 17a, and a second gate dielectric 17b may be conformally formed on the semiconductor substrate 3 having the first gate dielectric 17a by performing a deposition process. Therefore, a gate dielectric 18' including the first and second gate dielectrics 17a and 17b may be formed.

Next, the process of forming the first conductive material layer 21 (illustrated in FIG. 12) and the source material layer 24 (illustrated in FIG. 12) described with reference to FIG. 12 may be performed, and then the doped material layer 21b (illustrated in FIG. 15) and the second conductive material layer 33 may be formed using the method described with reference to FIGS. 13 to 15.

Next, the second conductive material layer 33 (illustrated in FIG. 15) and the doped material layer 21b (illustrated in FIG. 15) may be partially etched to form a gate electrode 36' including the conductive material layer 34 formed by being partially etched and the doped material layer 22' formed by being partially etched. An upper end portion of the doped material layer 22' may be formed at a lower level than an upper end portion of the conductive material layer 34. Next, a process of forming the insulating gate capping pattern 39 may be performed as described in FIG. 17. Therefore, as described with reference to FIGS. 5A and 5B, the gate dielectric 18' and the gate electrode 36' may be formed.

Next, an example of a method of forming the semiconductor device in accordance with an embodiment of the inventive concept described with reference to FIGS. 6A and 6B will be described with reference to FIGS. 19 to 24. FIGS. 19 to 24 are cross-sectional views illustrating a region taken along line I-I' of FIG. 1.

Figure 19:
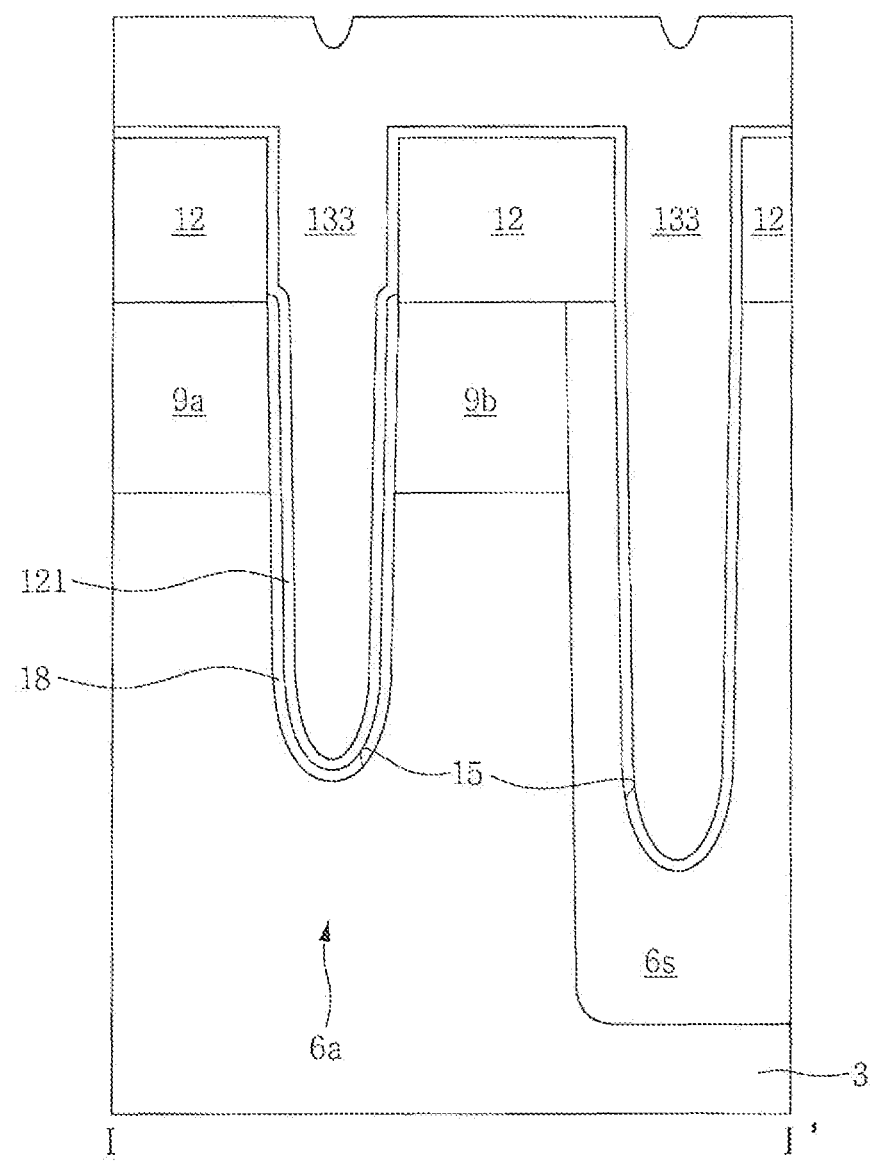
FIGS. 19 to 24 are cross-sectional views illustrating an example of a method of forming a semiconductor device in accordance with an embodiment of the inventive concept.

Referring to FIGS. 1 and 19, as described in FIG. 11, a field region 6s may be formed in a semiconductor substrate 3 to define an active region 6a, a first source/drain region 9a and a second source/drain region 9b may be formed in the active region 6a, a gate mask 12 may be formed on the semiconductor substrate 3 having the active region 6a and the field region 6s, and a gate trench 15 may be formed by etching the active region 6a and the field region 6s using the gate mask 12 as an etch mask.

As described with reference to FIG. 12, a gate dielectric 18 may be formed on the semiconductor substrate 3 having the gate trench 15, and a first conductive material layer 121 may be conformally formed on the semiconductor substrate 3 having the gate dielectric 18. The gate dielectric 18 may be formed on the active region 6a exposed by the gate trench 15. A second conductive material layer 133 may be formed on the first conductive material layer 121 to fill the gate trench 15. The first conductive material layer 121 may be formed of a metal nitride, for example, TiN or WN, and the second conductive material layer 133 may be formed of a metal material, for example, tungsten.

Figure 20:
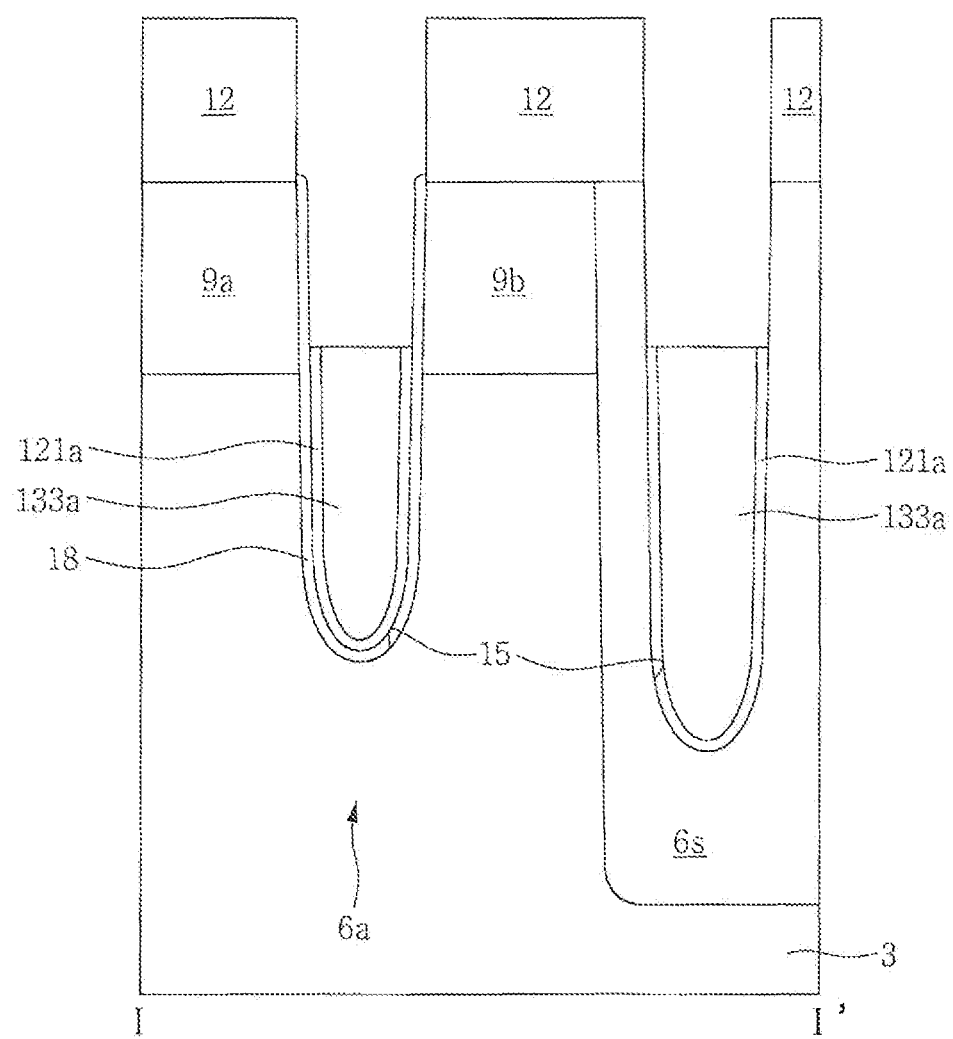

Referring to FIGS. 1 and 20, the second conductive material layer 133 (illustrated in FIG. 19) and the first conductive material layer 121 (illustrated in FIG. 19) may be partially etched to form a partially etched second conductive material layer 133a and a partially etched first conductive material layer 121a. The second conductive material layer 133a and the first conductive material layer 121a may partially fill the gate trench 15.

Figure 21:
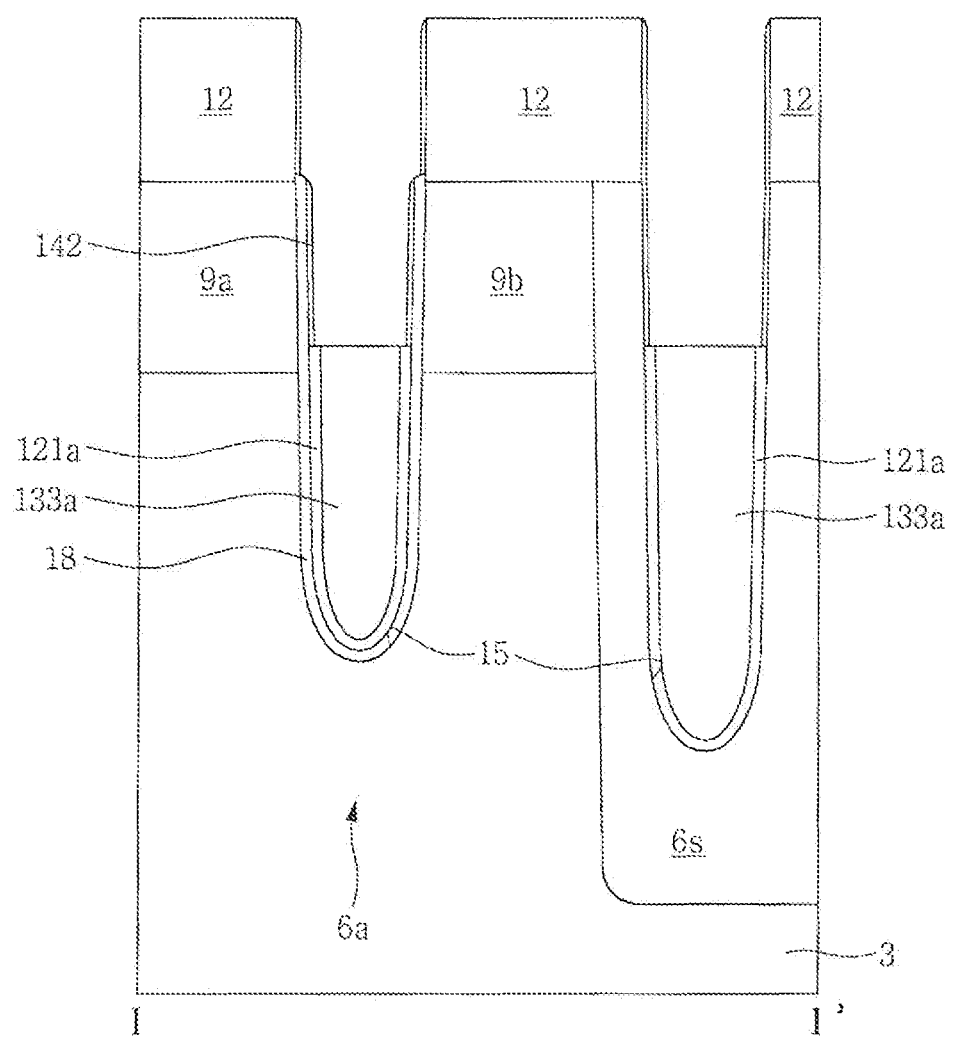

Referring to FIG. 21, an insulating buffer spacer 142 may be formed on a side wall of the gate trench 15 located above the first and second conductive material layers 121a and 133a. The insulating buffer spacer 142 may be formed of a high-k dielectric. For example, the insulating buffer spacer 142 may be formed of a material, such as HfSiON or the like.

Figure 22:
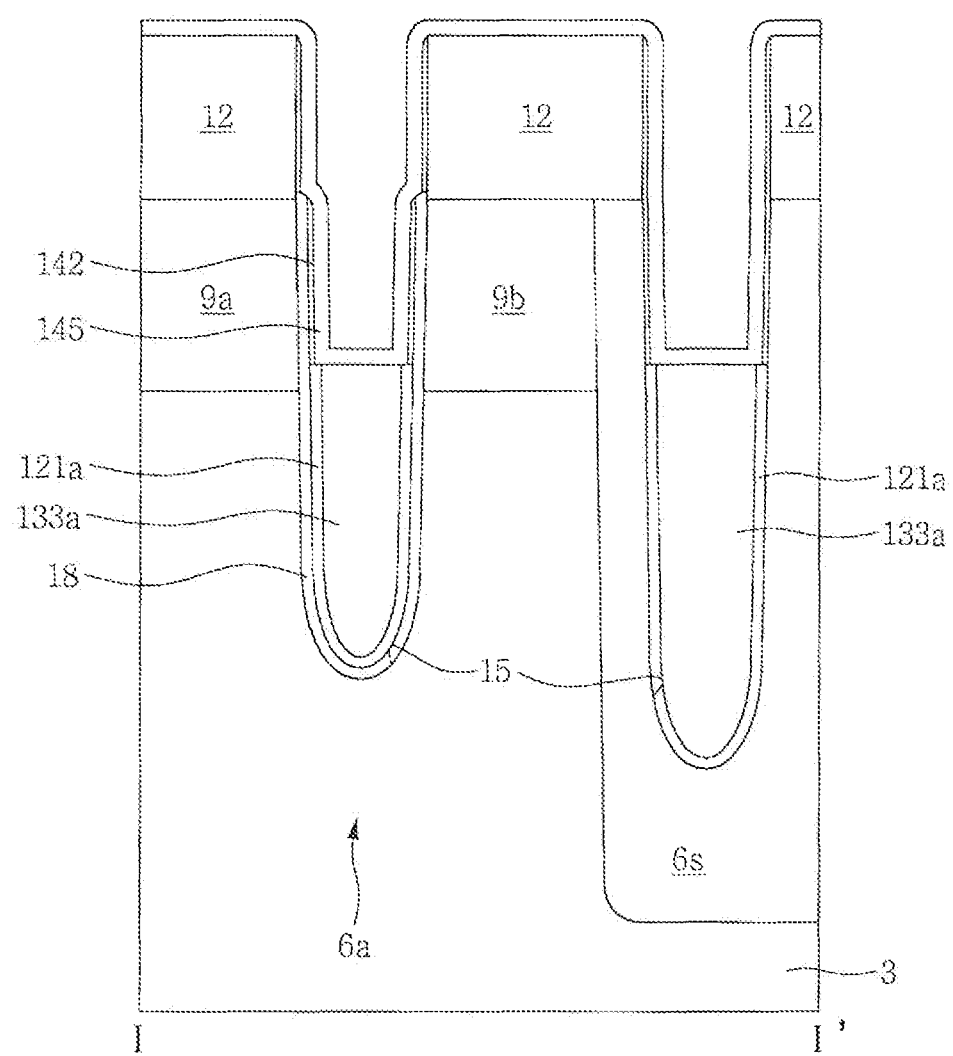

Referring to FIG. 22, a source material layer 145 may be formed on the semiconductor substrate 3 having the insulating buffer spacer 142. The source material layer 145 may be formed of a material including a first element, for example, a metal oxide including an element, such as La or the like.

Figure 23:
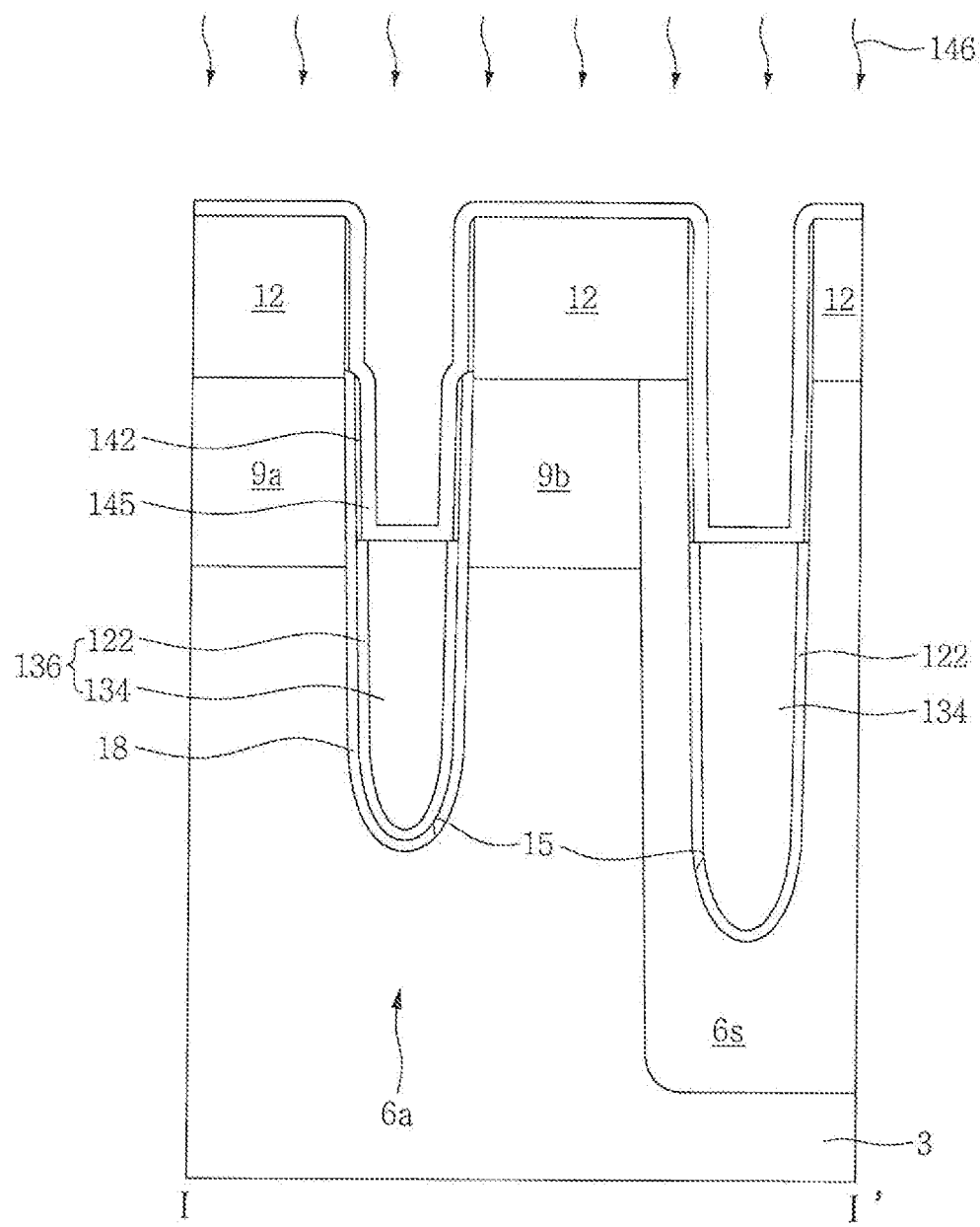
Figure 24:
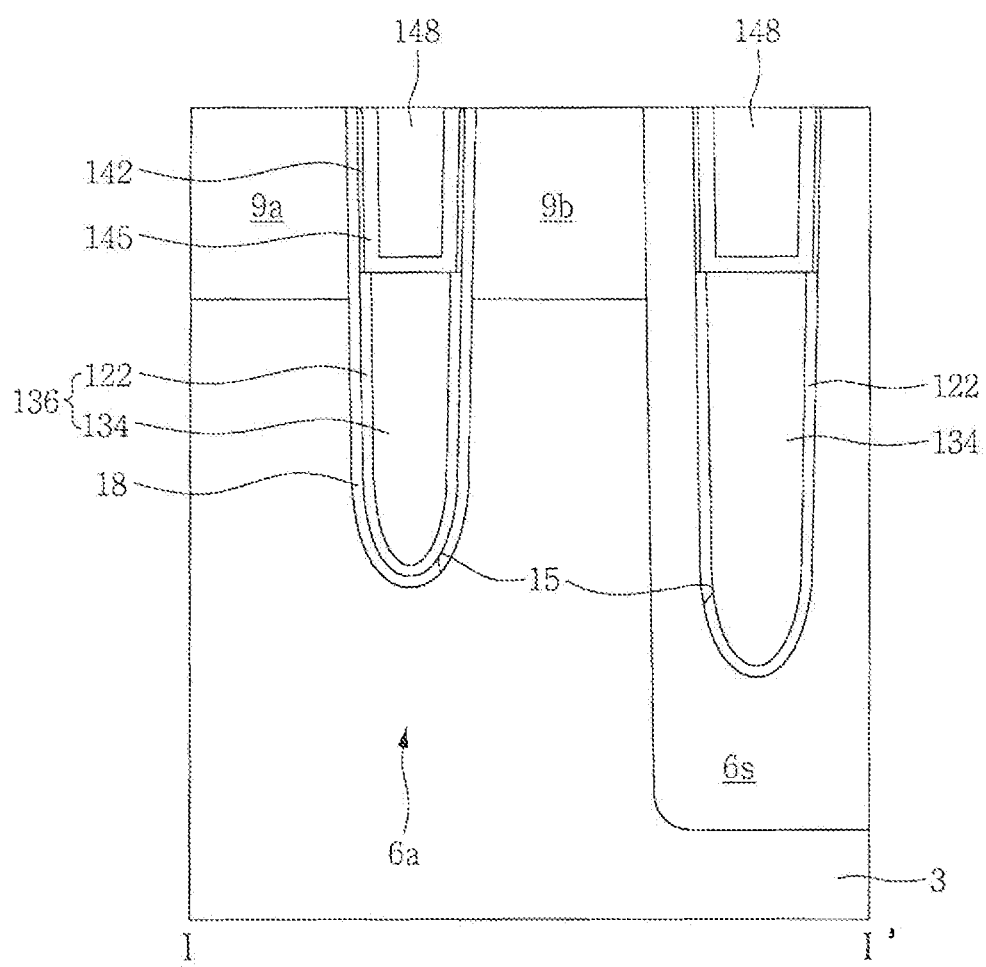

Referring to FIG. 23, by performing a thermal treatment process 146, the first element included in the source material layer 145, for example, an element, such as La or the like, may be diffused into the first and second conductive material layers 121a and 133a (illustrated in FIG. 22) to form first and second doped material layers 122 and 134. The first conductive material layer 121a (illustrated in FIG. 22) may be formed into a first doped material layer 122 of which a work function is changed while including the first element. The second conductive material layer 133a (illustrated in FIG. 22) may be formed into a second doped material layer 134 while including the first element. The first and second doped material layers 122 and 134 may constitute a gate electrode 136.

Next, an insulating gate capping pattern 148 may be formed on the source material layer 145 to fill remaining portions of the gate trench 15. The gate capping pattern 148 may be formed of silicon nitride.

In an example, the formation of the gate capping pattern 148 may include depositing an insulating material layer on the semiconductor substrate 3 having the gate electrode 136, planarizing the insulating material layer until the gate mask 12 (illustrated in FIG. 23) is exposed, and removing the gate mask 12 (illustrated in FIG. 23).

In an example, the gate electrode 136 is formed, the source material layer 145 is removed, and then the process of forming the gate capping pattern 148 may also be performed.

Referring to FIGS. 1, 6A, and 6B, the gate electrode 136 and the gate capping pattern 148 are formed, and then the processes of forming the bit line structure 212, the contact structure 235, and the data storage element 250 may be sequentially performed as described in FIGS. 2A and 2B.

The inventive concept is not limited to the method of forming the source material layer 145 and the gate electrode 136 described with reference to FIGS. 22 and 23. An example of the method of forming the source material layer 145 and the gate electrode 136 will be described with reference to FIGS. 7A and 7B.

Referring to FIGS. 1, 7A, and 7B, using the same method as described with reference to FIGS. 19 to 21, a semiconductor substrate 3 having the first and second conductive material layers 121a and 133a, and the insulating buffer spacer 142 may be provided. After a source material layer is formed on the semiconductor substrate 3 having the insulating buffer spacer 142, a first element included in the source material layer may be diffused into upper regions of the first and second conductive material layers 121a and 133a by performing a thermal treatment process to form a gate electrode 136' including partially doped first and second conductive material layers 122' and 134'. The first conductive material layer 122' may include a first portion 122a in which the first element is not doped and a second portion 122b with which the first element is doped. The second conductive material layer 134' may include a first portion 134a in which the first element is not doped and a second portion 134b with which the first element is doped.

The inventive concept is not limited to the method of forming the source material layer 145 and the gate electrode 136 described with reference to FIGS. 20 to 23. An example of the method of forming the source material layer 145 and the gate electrode 136 will be described with reference to FIGS. 8A and 8B.

Referring to FIGS. 1, 8A, and 8B, a semiconductor substrate 3 having the first and second conductive material layers 121 and 133 may be provided as described with reference to FIG. 19.

The first and second conductive material layers 121 and 133 may be partially etched to form a partially etched first conductive material layer and a partially etched second conductive material layer. An upper end portion of the partially etched first conductive material layer may be formed at a lower level than an upper end portion of the partially etched second conductive material layer.

An insulating spacer material layer may be conformally formed on the semiconductor substrate 3 having the partially etched first and second conductive material layers, and the spacer material layer may be anisotropically etched to form an insulating buffer spacer 142'.

Next, a source material layer 145' may be conformally formed on the semiconductor substrate 3 having the insulating buffer spacer 142', a first element included in the source material layer 145' may be diffused into upper regions of the first and second conductive material layers 123 and 135 by performing a thermal treatment process to form doped portions 123b and 135b. Therefore, a gate electrode 136" including the first and second doped material layers 123 and 115 may be formed as described with reference to FIGS. 8A and 8B.

Next, an example of a method of forming a structure of the semiconductor device described with reference to FIGS. 9 and 10 will be described with reference to FIGS. 25 to 32. FIGS. 25 to 32 are cross-sectional views illustrating regions taken along lines II-II', III-III', IV-IV', and V-V' of FIG. 9.

Figure 25:
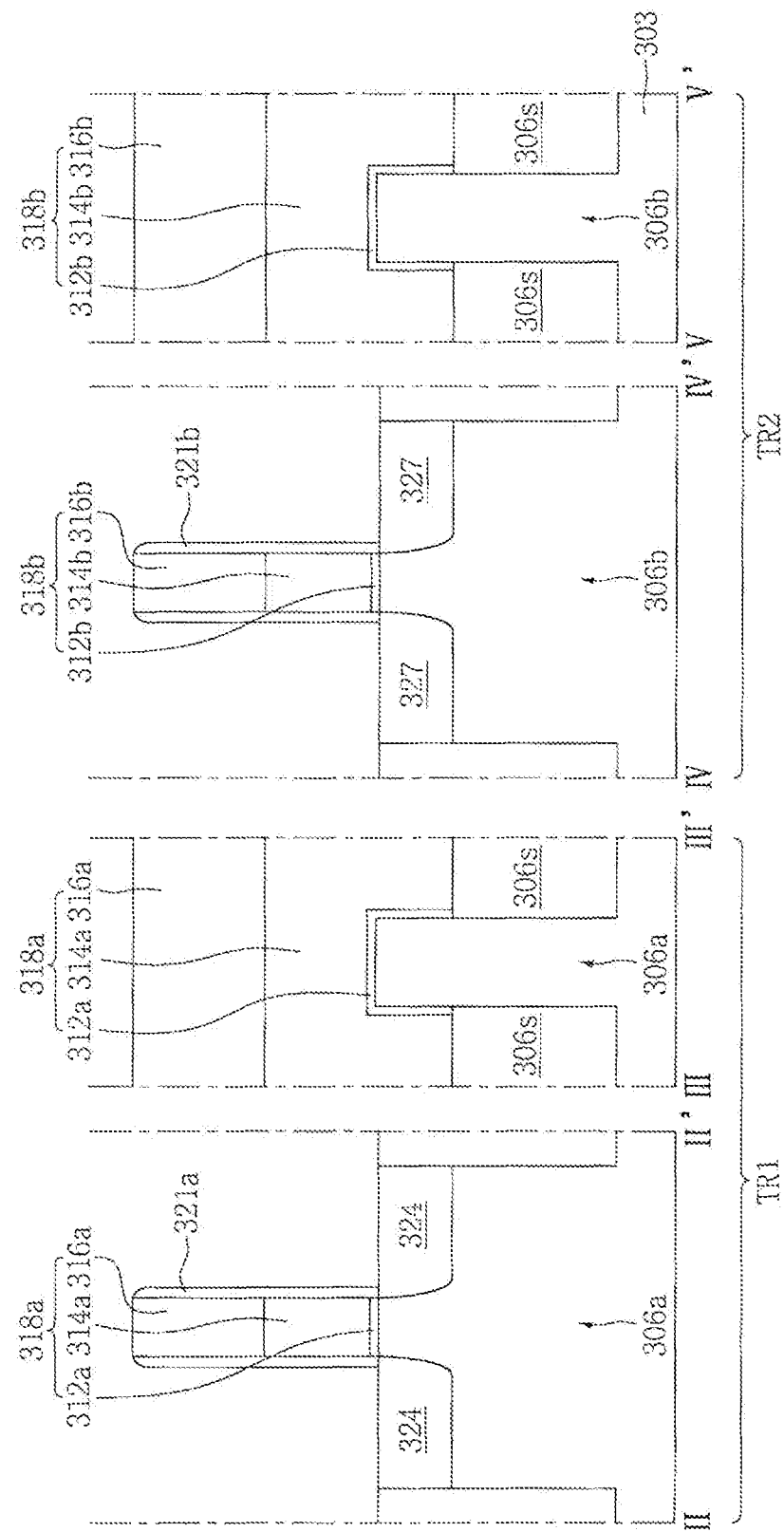
FIGS. 25 to 32 are cross-sectional views illustrating an example of a method of forming a semiconductor device in accordance with an embodiment of the inventive concept.

Referring to FIGS. 9 and 25, a semiconductor substrate 303 having a first transistor region TR1 and a second transistor region TR2 may be provided. The first transistor region TR1 may be an NMOS transistor region, and the second transistor region TR2 may be a PMOS transistor region.

A field region 306s may be formed to define a first active region 306a in the first transistor region TR1 of the semiconductor substrate 303 and a second active region 306b in the second transistor region TR2 of the semiconductor substrate 303. The field region 306s may be an STI.

In an example, each of the first and second active regions 306a and 306b may be formed in a fin active structure having a portion protruding from the field region 306s.

A first sacrificial gate structure 318a, which crosses the first active region 306a and extends onto the field region 306s, and a second sacrificial gate structure 318b, which crosses the second active region 306b and extends onto the field region 306s may be formed.

The first sacrificial gate structure 318a may include a base insulating pattern 312a, a lower sacrificial pattern 314a, and an upper sacrificial pattern 316a, which are sequentially stacked. The second sacrificial gate structure 318b may include a base insulating pattern 312b, a lower sacrificial pattern 314b, and an upper sacrificial pattern 316b, which are sequentially stacked. The base insulating patterns 312a and 312b may be formed of silicon oxide, the lower sacrificial patterns 314a and 314b may be formed of polysilicon, and the upper sacrificial patterns 316a and 316b may be formed of silicon nitride.

A first gate spacer 321a may be formed on side surfaces of the first sacrificial gate structure 318a, and a second gate spacer 321b may be formed on side surfaces of the second sacrificial gate structure 318b. The first and second gate spacers 321a and 321b each may be formed of an insulating material.

First source/drain regions 324 may be formed in the first active region 306a located at both sides of the first sacrificial gate structure 318a. Second source/drain regions 327 may be formed in the second active region 306b located at both sides of the second sacrificial gate structure 318b.

Figure 26:
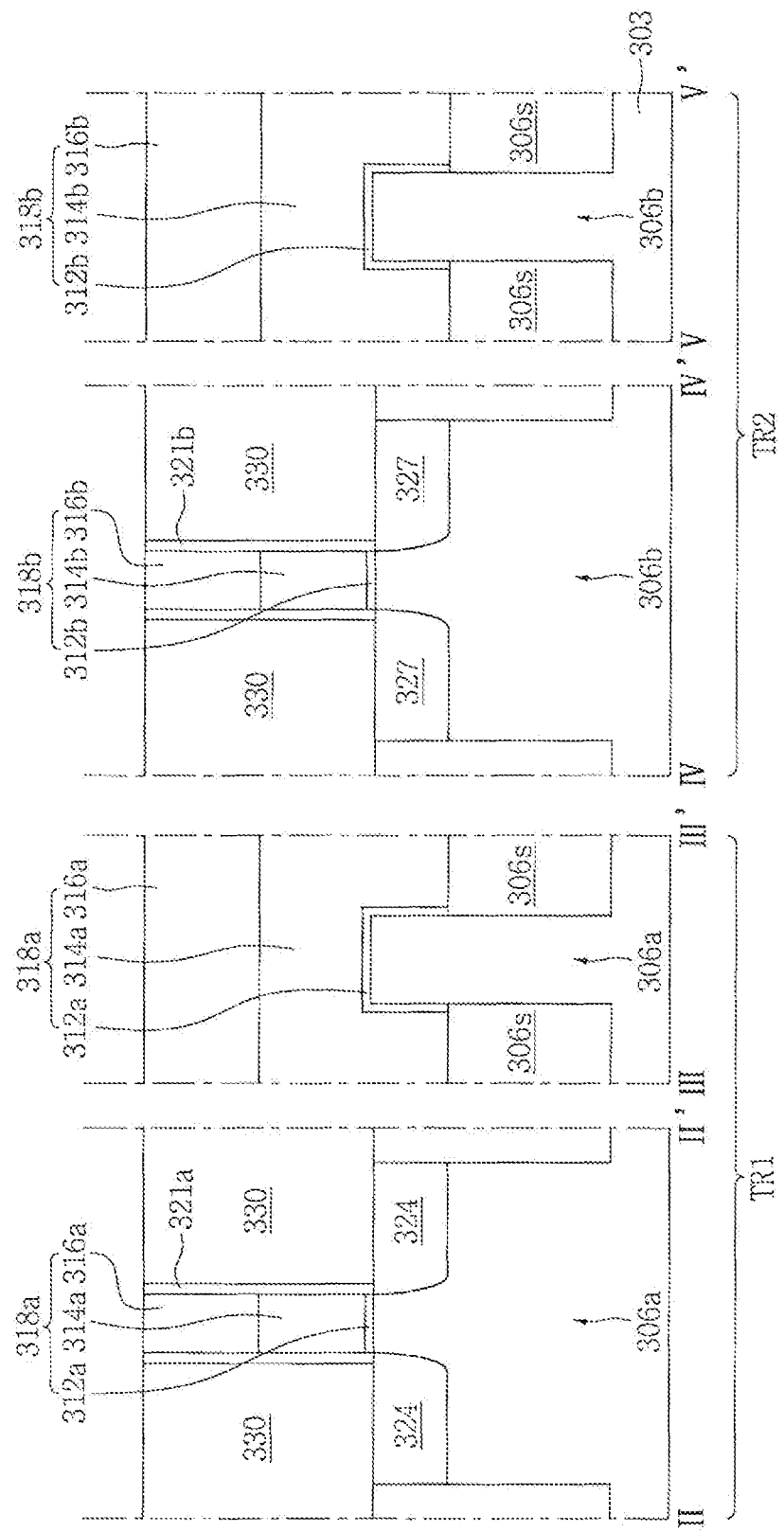

Referring to FIGS. 9 and 26, an insulating layer may be formed on the semiconductor substrate 303 having the first and second gate spacers 321a and 321b, and the insulating layer may be planarized until upper surfaces of the first and second sacrificial gate structures 318a and 318b are exposed to form an interlayer insulating layer 330.

Figure 27:
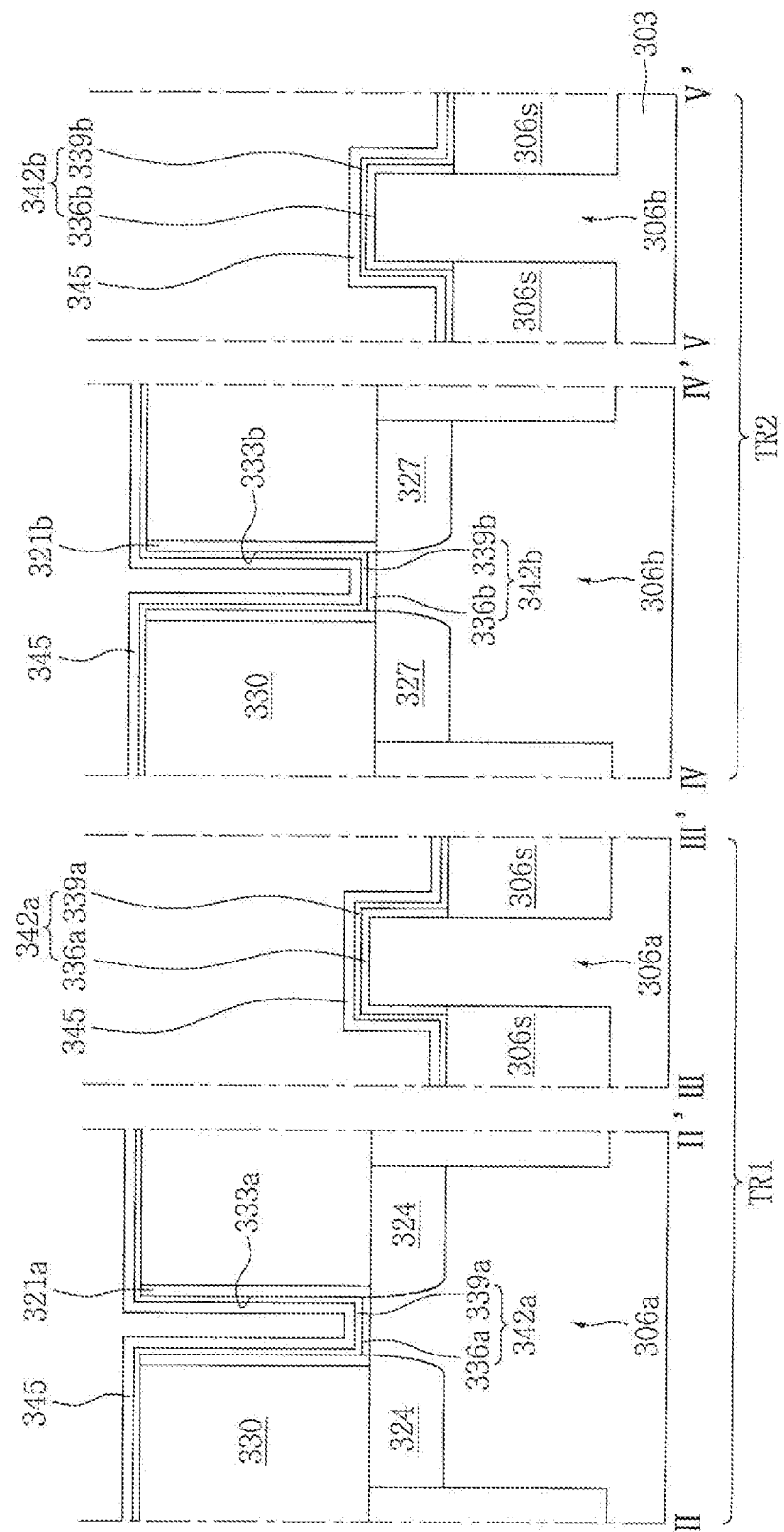

Referring to FIGS. 9 and 27, the first sacrificial gate structure 318a may be removed to form a first gate trench 333a, and in addition, the second sacrificial gate structure 318b may be removed to form a second gate trench 333b.

A first gate dielectric 342a may be formed on an inner wall of the first gate trench 333a, and a second gate dielectric 342b may be formed on an inner wall of the second gate trench 333b.

The first gate dielectric 342a may include a first lower gate dielectric 336a interposed between the first gate electrode 366a and the first active region 306a, and a first upper gate dielectric 339a, which is disposed on the first lower gate dielectric 336a and covers a bottom surface and side surfaces of the first gate electrode 366a. The first lower gate dielectric 336a may include a thermal oxide grown from the first active region 306a by performing a thermal oxidation process. The first lower gate dielectric 336a may be formed of a dielectric formed using a deposition process, such as an ALD process, for example, a high-k dielectric having a higher dielectric constant than silicon oxide.

The second gate dielectric 342b may include a second lower gate dielectric 336b interposed between the second gate electrode 366b and the second active region 306b, and a second upper gate dielectric 339b which is disposed on the second lower gate dielectric 336b and covers a bottom surface and side surfaces of the second gate electrode 366b. The second lower gate dielectric 336b may include a thermal oxide grown from the second active region 306b by performing a thermal oxidation process. The second lower gate dielectric 336b may be formed of a dielectric formed using a deposition process, such as an ALD process, for example, a high-k dielectric having a higher dielectric constant than silicon oxide.

A lower conductive material layer 345 may be formed on the semiconductor substrate 303 having the first and second gate dielectrics 342a and 342b. The lower conductive material layer 345 may include a conductive material including nitrogen, for example, TiN.

Figure 28:
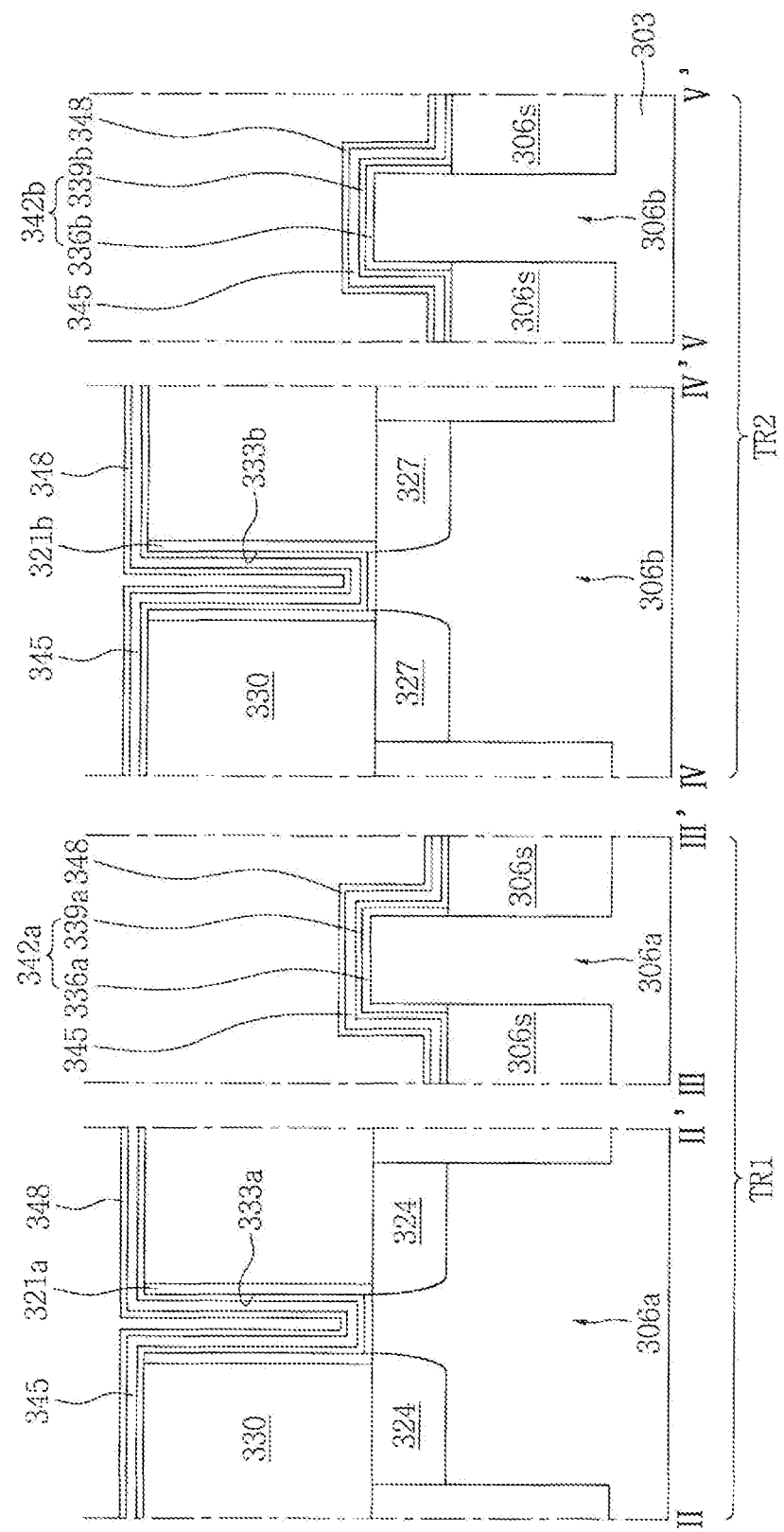

Referring to FIGS. 9 and 28, a first source material layer 348 including a first element may be formed on the lower conductive material layer 345. The first source material layer 348 may be formed of a metal oxide, such as LaO or the like, including the first element, such as La or the like.

Figure 29:
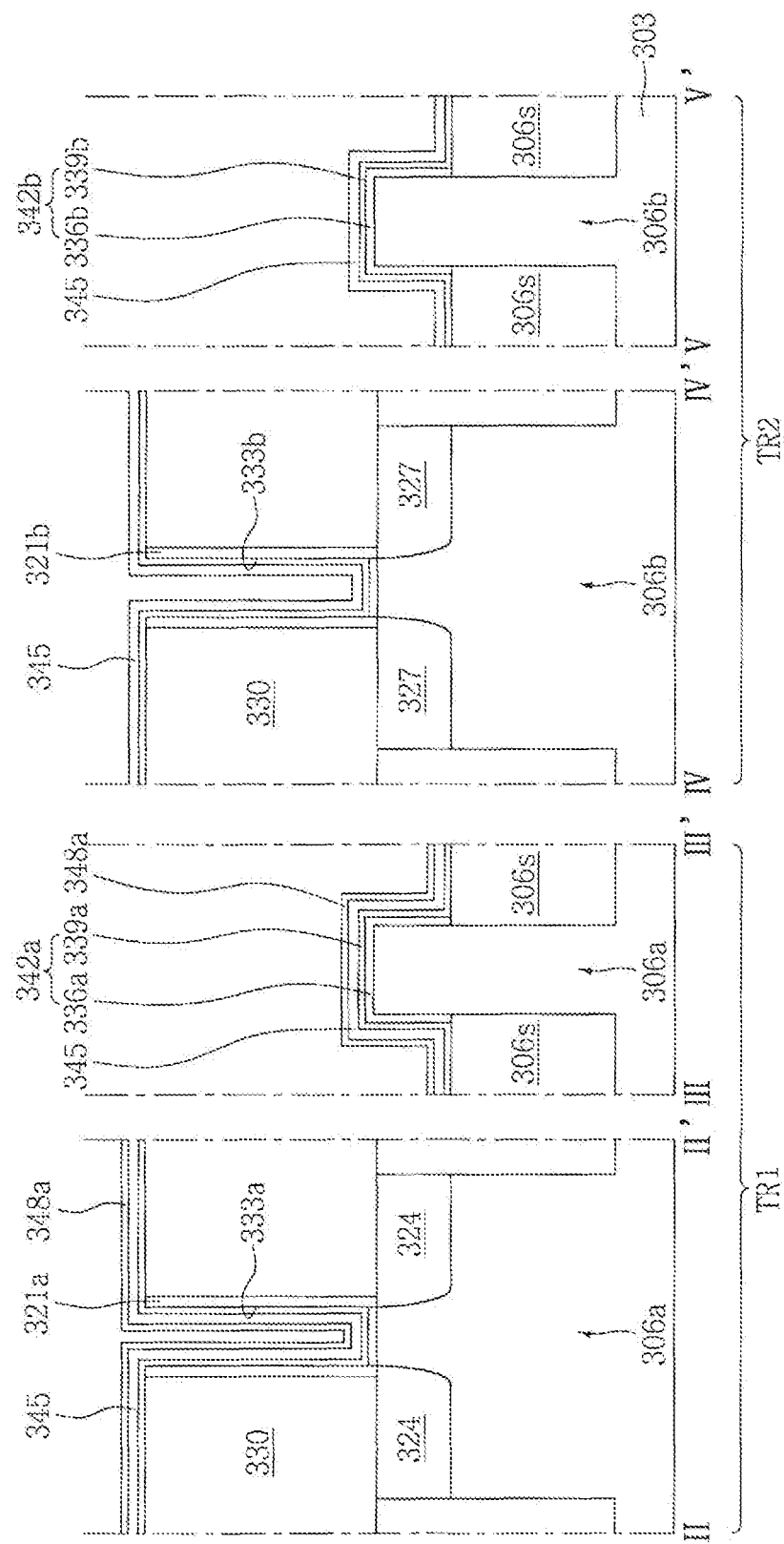

Referring to FIGS. 9 and 29, the first source material layer 348 located on the second transistor region TR2 may be selectively removed. Therefore, a remaining first source material layer 348a may be formed on the first transistor region TR1.

Figure 30:
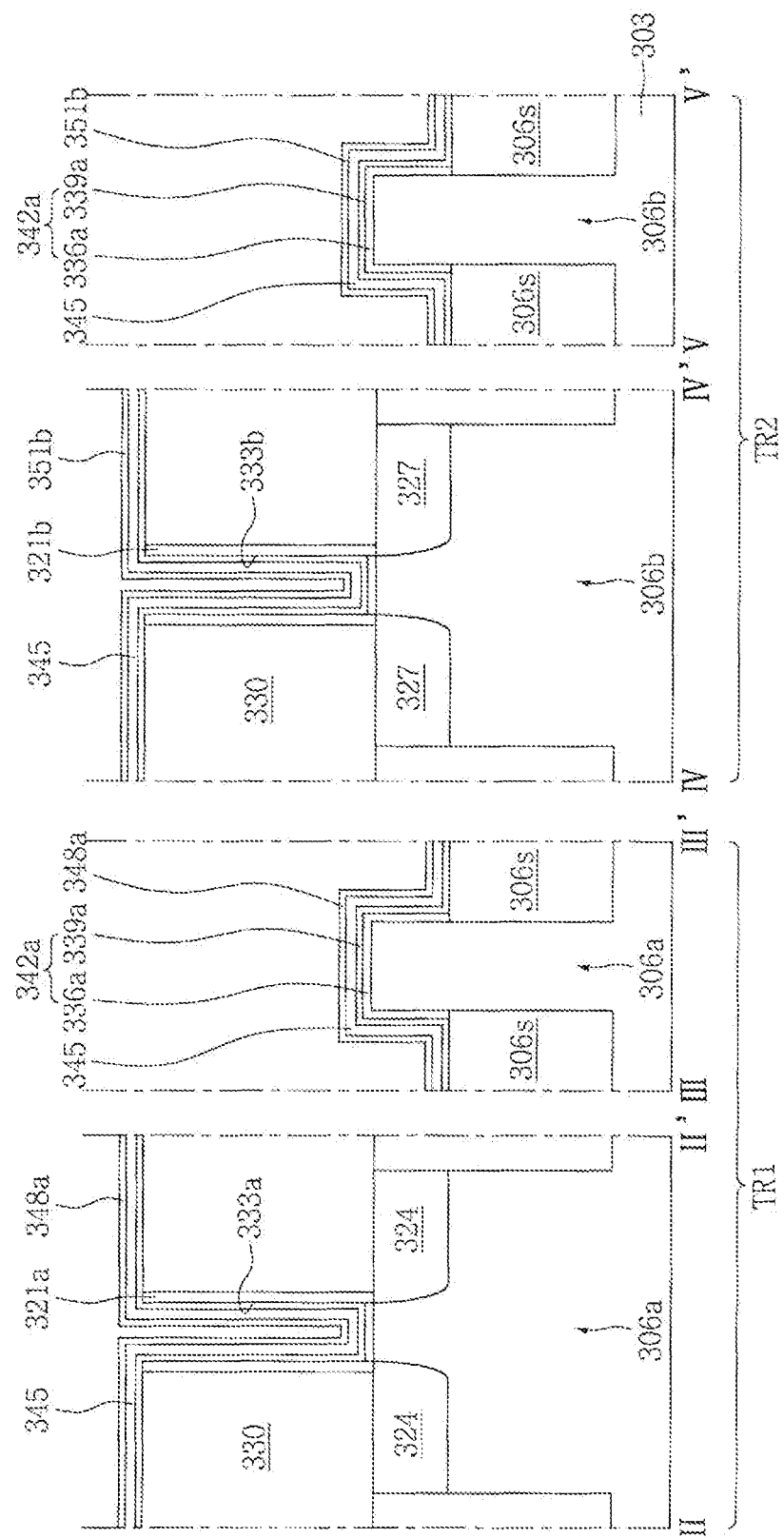

Referring to FIGS. 9 and 30, a second source material layer 351b may be selectively formed on the lower conductive material layer 345 located on the second transistor region TR2. For example, a second source material layer including a second element may be formed on the semiconductor substrate 303 having the remaining first source material layer 348a, and then the second source material layer located on the first transistor region TR1 may be selectively removed to form the remaining second source material layer 351b on the second transistor region TR2.

The second source material layer 351b may be a different material from the first source material layer 348a. For example, the first source material layer 348a may be a metal oxide including the first element, for example, La, and the second source material layer 351b may be a metal oxide including a second element different from the first element, for example, Al, Hf, or Zr.

Figure 31:
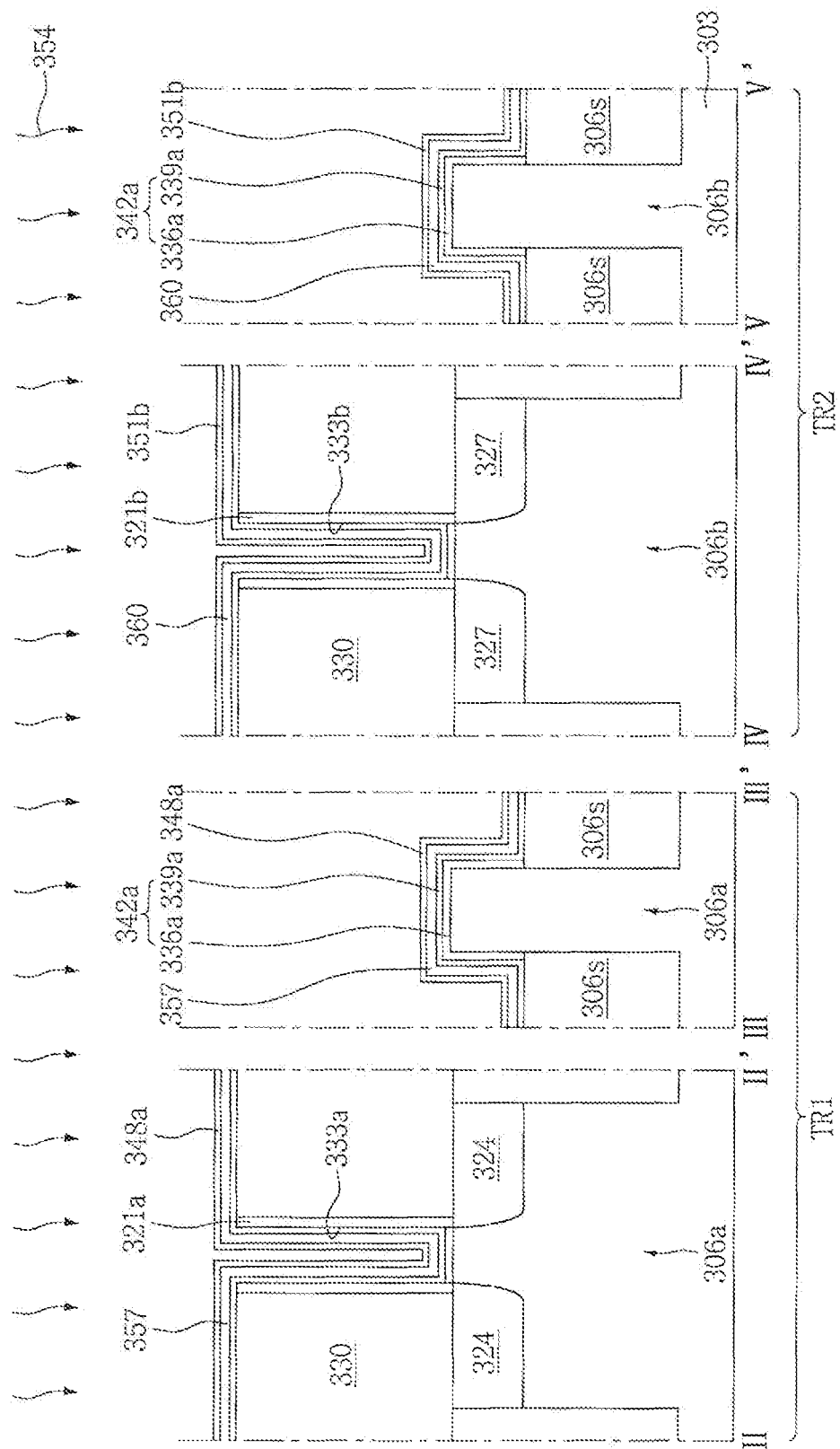

Referring to FIGS. 9 and 31, by performing a thermal treatment process 354, the first element included in the first source material layer 348a may be diffused into the lower conductive material layer 345 (illustrated in FIG. 30) to form a first doped material layer 357, and the second element included in the second source material layer 351b may be diffused into the lower conductive material layer 345 (illustrated in FIG. 30) to form a second doped material layer 360. Therefore, the first and second doped material layers 357 and 360 may be formed of materials including different elements from each other. For example, the first doped material layer 357 may be formed of a metal nitride including La, and the second doped material layer 360 may be formed of a metal nitride including Al, Hf, or Zr.

Figure 32:
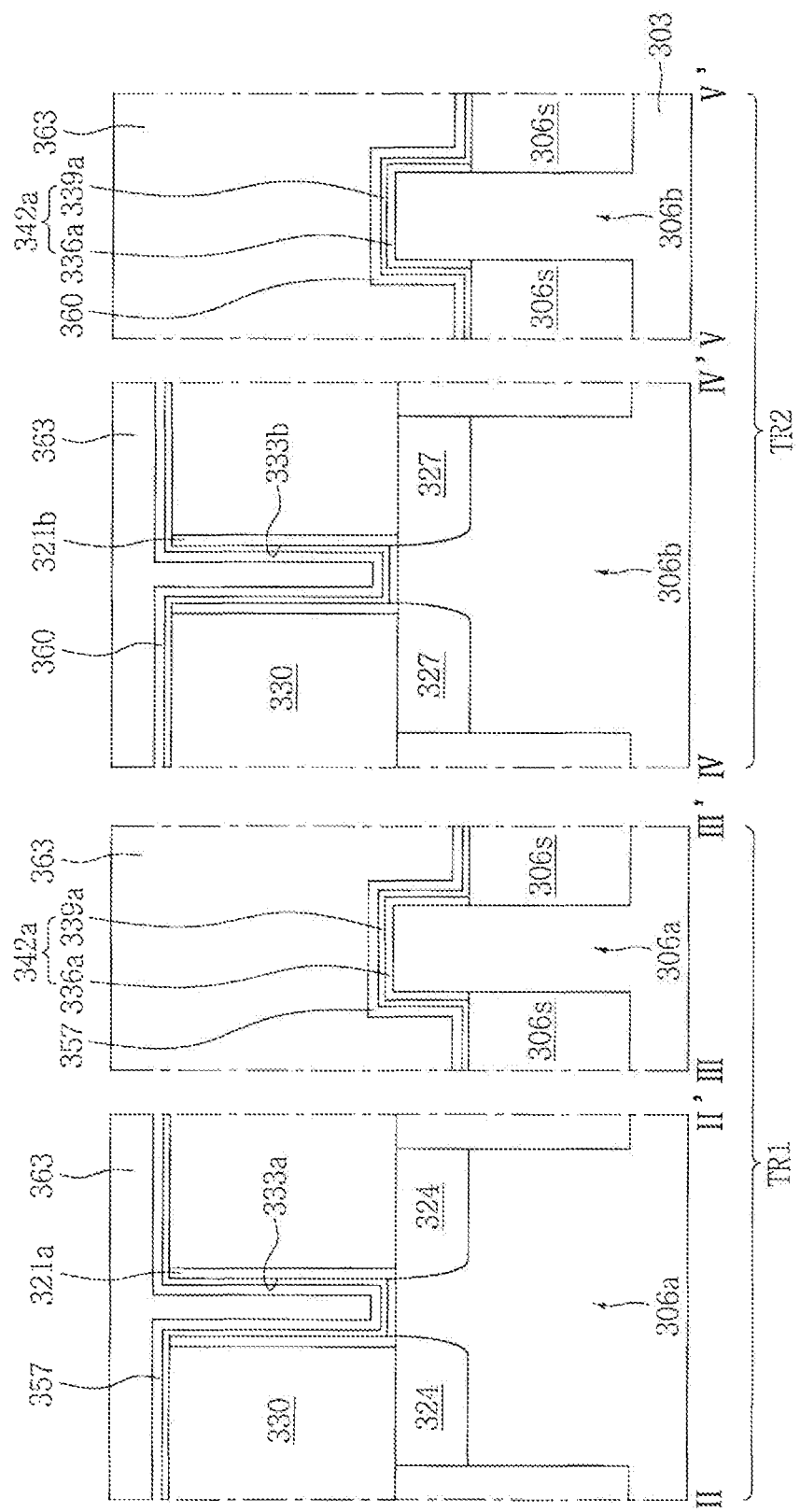

Referring to FIGS. 9 and 32, an upper conductive material layer 363 may be formed on the semiconductor substrate 303 having the first and second doped material layers 357 and 360 to fill the first and second gate trenches 333a and 333b. The upper conductive material layer 363 may be formed of a metal material, such as tungsten or the like.

Referring again to FIG. 10, the upper conductive material layer 363, and the first and second doped material layers 357 and 360 may be planarized until the interlayer insulating layer 330 is exposed to form a first gate electrode 366a defined in the first gate trench 333a and a second gate electrode 366b defined in the second gate trench 333b.

The semiconductor device formed using the method of forming the semiconductor device according to the embodiments of the inventive concept may be used to make a semiconductor package as a part, and the part may be used in various electronic systems and commercialized. For example, the semiconductor device formed using the method of forming the semiconductor device according to the embodiments of the inventive concept may be used in a portable communication device, a smart phone, a tablet PC, a portable electronic system in which the Internet web surfing is possible, an electronic system for storing and playing music or video files, a navigation device, a solid state disk (SSD), a table computer, an automobile and a home appliance.

According to the embodiments of the inventive concept, a method of forming a semiconductor device having a gate and the semiconductor device manufactured by the method can be provided.

The gate according to the embodiments of the inventive concept may include a gate dielectric not including a first element and a gate electrode including the first element. The gate electrode may include a doped material layer including the first element. The formation of the doped material layer may include forming a source material layer including the first element on a first conductive material layer not including the first element, and diffusing the first element included in the source material layer into the first conductive material layer by performing a thermal treatment process.

The first element may be diffused into the first conductive material layer to change a work function of the first conductive material layer. For example, in a case of an N-channel mosfet transistor (NMOS) transistor, the first element may be an element on a periodic table of elements, for example, La, which may lower the effective work function of the first conductive material layer by being diffused into the first conductive material layer. Therefore, a semiconductor device having a gate capable of improving a threshold voltage characteristic of a transistor can be provided.

The first conductive material layer may be formed to have a generally uniform thickness. Also, the source material layer may be formed to have a generally uniform thickness. Therefore, the first element may be generally uniformly diffused from a surface of the first conductive material layer into the first conductive material layer. Therefore, because the doped material layer is formed to have a generally uniform property, a distribution characteristic of the semiconductor device can be improved.

The gate according to the embodiments of the inventive concept may include a gate electrode including the doped material layer capable of improving a threshold voltage characteristic of a transistor and a conductive material layer capable of improving an electrical resistance characteristic of the gate. The conductive material layer may be formed of a conductive material having a lower resistivity than the doped material layer.

The source material layer for supplying the first element into the first conductive material layer may be formed so as not to be directly in contact with the gate dielectric. Further, the first element included in the source material layer may be diffused into the first conductive material layer using a thermal treatment process. Therefore, the first element may not be diffused into the gate dielectric. Therefore, by the process of diffusing the first element into the first conductive material layer, the electrical characteristic of the gate dielectric may not be changed or the reliability thereof may not be degraded. That is, while the electrical characteristic and reliability of the gate dielectric are not degraded, the first element may be selectively diffused into the first conductive material layer to form the doped material layer. Therefore, while the electrical characteristic and reliability of the gate dielectric are not degraded, a method of changing an effective work function of a material layer of the gate electrode in contact with the gate dielectric can be provided.

Although a few embodiments have been described with reference to the accompanying drawings, those skilled in the art will readily appreciate that many modifications are possible in embodiments without departing from the scope of the inventive concept and without changing essential features. Therefore, the above-described embodiments should be considered in a descriptive sense only and not for purposes of limitation.

What is claimed is:

1. A method of forming a semiconductor device, comprising:
    forming a gate trench in an active region;
    forming a gate dielectric on an inner wall of the gate trench;
    forming a conductive material layer on the gate dielectric;
    forming an insulating buffer spacer on a side wall of the gate trench and on the conductive material layer;
    forming a source material layer on the conductive material layer after forming the insulating buffer spacer, the source material layer comprising a first element;
    diffusing the first element into the conductive material layer to form a doped material layer having a different work function from the conductive material layer.

2. The method of claim 1, wherein the conductive material layer is a first conductive material layer, the method further comprising:
    removing the source material layer after the forming of the doped material layer; and
    forming a second conductive material layer in the gate trench on the doped material layer.

3. The method of claim 2, further comprising etching the second conductive material layer and the doped material layer to form a gate electrode,
    wherein the gate electrode partially fills the gate trench.

4. The method of claim 1, wherein the gate dielectric does not include the first element after the forming of the doped material layer.

5. The method of claim 1, wherein the doped material layer is formed of a material in which the first element is doped in a metal nitride, the gate dielectric is formed of an oxide not including the first element; and the first element is an element on a periodic table of elements, which decreases a work function of the metal nitride.

6. The method of claim 1, wherein a doping concentration of the first element in a first portion of the doped material layer is higher than that of the first element in a second portion of the doped material layer;

wherein the first portion is farther away from the gate dielectric than the second portion.

7. The method of claim 1, wherein the doped material layer comprises a WN material or TiN and the first element comprises La.

8. The method of claim 1, wherein the doped material layer covers side surfaces and a bottom surface of the conductive material layer.

9. The method of claim 8, wherein an upper end portion of the doped material layer is formed at a lower level than an upper end portion of the conductive material layer relative to the gate dielectric.

10. The method of claim 1, wherein the conductive material layer is formed on the gate dielectric and partially fills the gate trench.

11. A method of forming a semiconductor device, comprising:

forming a gate trench configured to cross an active region;

forming a gate dielectric on an inner wall of the gate trench;

forming an insulating buffer spacer on a portion of the gate dielectric;

conformally forming a first conductive material layer on the gate dielectric;

forming a second conductive material layer in the gate trench, on the first conductive material layer;

forming a source material layer on the first and second conductive material layers, the source material layer comprising a first element, the insulating buffer spacer being between the source material layer and the gate dielectric;

diffusing the first element into the first and second conductive material layers to form first and second doped material layers, respectively, the first doped material layer having a different work function from the first conductive material layer; and removing the source material layer formed on the first and second doped material layers.

12. The method of claim 11, wherein the first doped material layer has a lower work function than the first conductive material layer.

13. The method of claim 11, wherein the first doped material layer covers side surfaces and a bottom surface of the second doped layer.

14. The method of claim 11, wherein the first doped material layer is formed of a material with which the first element is doped in a metal nitride.

15. The method of claim 11, wherein the second doped material layer is formed of a material with which the first element is doped in a metal material.

16. The method of claim 11, wherein the first doped material layer comprises one of WN and TiN, and the second doped layer comprises W; and wherein the first element comprises La.

17. A method of forming a semiconductor device, comprising:

forming a gate trench in an active region;

forming a gate dielectric on an inner wall of the gate trench;

forming a conductive material layer on the gate dielectric;

forming a source material layer on the conductive material layer, the source material layer comprising a first element;

diffusing the first element into the conductive material layer to form a doped material layer having a different work function from the conductive material layer;

removing the source material layer after the forming of the doped material layer; and partially etching the doped material layer to decrease a thickness of the doped material layer.

* * * * *